(12) United States Patent
Kang et al.

(10) Patent No.: US 6,888,202 B2
(45) Date of Patent: May 3, 2005

(54) LOW-POWER HIGH-PERFORMANCE STORAGE CIRCUITRY

(75) Inventors: Sung-Mo Kang, Santa Cruz, CA (US); Seung-Moon Yoo, Austin, TX (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 10/402,059

(22) Filed: Mar. 27, 2003

(65) Prior Publication Data

US 2004/0079978 A1 Apr. 29, 2004

Related U.S. Application Data

(60) Provisional application No. 60/368,392, filed on Mar. 27, 2002.

(51) Int. Cl.⁷ .............................................. H04L 29/76
(52) U.S. Cl. ..................... 257/391; 257/350; 257/351; 257/390; 257/391; 257/392; 257/393; 438/217; 438/276; 438/289
(58) Field of Search ................................. 257/350, 351, 257/390, 391, 392, 393; 438/217, 276, 289

(56) References Cited

U.S. PATENT DOCUMENTS

| | | | |
|---|---|---|---|
| 4,929,853 A | * 5/1990 | Kim et al. ..................... 326/81 |
| 5,151,620 A | 9/1992 | Lin |
| 5,175,448 A | 12/1992 | Fujii |
| 5,703,522 A | * 12/1997 | Arimoto et al. ............. 327/534 |
| 5,748,016 A | * 5/1998 | Kurosawa .................... 327/108 |
| 5,774,393 A | * 6/1998 | Kuriyama .................... 365/156 |
| 5,880,604 A | 3/1999 | Kawahara et al. |
| 5,896,336 A | * 4/1999 | McClure ...................... 365/205 |
| 6,049,245 A | 4/2000 | Son et al. |
| 6,107,869 A | 8/2000 | Horiguchi et al. |
| 6,191,615 B1 | 2/2001 | Koga |
| 6,307,234 B1 | * 10/2001 | Ito et al. ....................... 257/371 |
| 6,404,269 B1 | 6/2002 | Voldman |
| 6,411,157 B1 | 6/2002 | Hsu et al. |

OTHER PUBLICATIONS

U.S. patent application Ser. No. 10/153,158, Yoo et al., filed May 21, 2002.

Assaderaghi et al., "A Dynamic Threshold Voltage MOS-FET (DTMOS) for Ultra–Low Voltage Operation", *International Electron Devices Meeting, Digest of Technical Papers*, pp. 809–812, Jun. 1994.

(Continued)

*Primary Examiner*—Allan R. Wilson
*Assistant Examiner*—Edgardo Ortiz
(74) *Attorney, Agent, or Firm*—Morrison & Foerster LLP

(57) ABSTRACT

An integrated circuit is provided comprising a latch circuit including, a first inverter including a first high threshold voltage PMOS transistor and a first high threshold voltage NMOS transistor with a first data node comprising interconnected source/drains (S/D) of the first PMOS and NMOS transistors; a second inverter including a second high threshold voltage PMOS transistor and a second high threshold voltage NMOS transistor with a second data node comprising interconnected source/drains (S/D) of the second PMOS and NMOS transistors; wherein the gates of the first PMOS and first NMOS transistors are coupled to the second data node; wherein the gates of the second PMOS and second NMOS transistors are coupled to the first data node; a first low threshold voltage access transistor including a first S/D coupled to the first data node and to the gate of the second PMOS transistor and to the gate of the second NMOS transistor and including a second S/D coupled to a first data access node and including a gate coupled to a first access control node; and a second low threshold voltage access transistor including a first S/D coupled to the second data node and to the gate of the first PMOS transistor and to the gate of the first NMOS transistor and including a second S/D coupled to a second data access node and including a gate coupled to a second access control node.

34 Claims, 15 Drawing Sheets

OTHER PUBLICATIONS

Amendment A for the U. S. patent application 10/153,158, Yoo et al., filed May 21, 2002, 13 pgs. Apr. 9, 2003.

J. Burr and J. Sholt, "A 200mV Self–Testing Encoder/Decoder using Stanford Ultra–Low–Power CMOS", *ISSCC Digest of Technical Papers*, pp. 84–85, Feb. 1994.

M. Horiguchi et al., "Switched–Source–Impedance CMOS Circuit for Low Standby Subthreshold Current Giga–Scale LSI's", *IEEE Journal of Solid State Circuits*, 28(11):1131–1135, Nov. 1993.

T. Iwata et al., "Gate–Over–Driving CMOS Architecture for 0.5V Single–Power–Supply–Operated Devices", *ISSCC Digest of Technical Papers*, pp. 290–291, Feb. 1997.

Kawaguchi et al., "A CMOS Scheme for 0.5V Supply Voltage with Pico–Ampere Standby Current", *ISSCC Digest of Technical Papers*, pp. 192–193, Feb. 1998.

T. Kuroda et al., "A 0.9V 150MHz 10mW 4mm² 2D Discrete Transform Core Processor with Varibale–Threshold–Voltage Scheme", *ISSCC Digest of Technical Papers*, pp. 166–167, Feb. 1996.

Mutoh et al., "1–V Power Supply High–Speed Digital Circuit Technology with Multithreshold–Voltage CMOS", *IEEE Journal of Solid State Circuits*, 30(8): 845–854, Aug. 1995.

K. Seta et al., "50% Active–Power Saving without Speed Degradation Using Standby Power Reduction (SPR) Circuit", in *ISSCC Digest of Technical Papers*, pp. 318–319, Feb. 1995.

S. Shigematsu et al., "A 1–V High–Speed MTCMOS Circuit Scheme for Power–Down Application Circuits", *IEEE Journal of Solid State Circuits*, 32(6):861–869, Jun. 1997.

Seung–Moon Yoo et al., "New High Performance Sub–1V Circuit Technique with Reduced Standby Current and Robust Data Holding", IEEE International Symposium on Circuits and Systems, May 28–31, 2000, Geneva, Switzerland (pp. 1–4).

* cited by examiner-

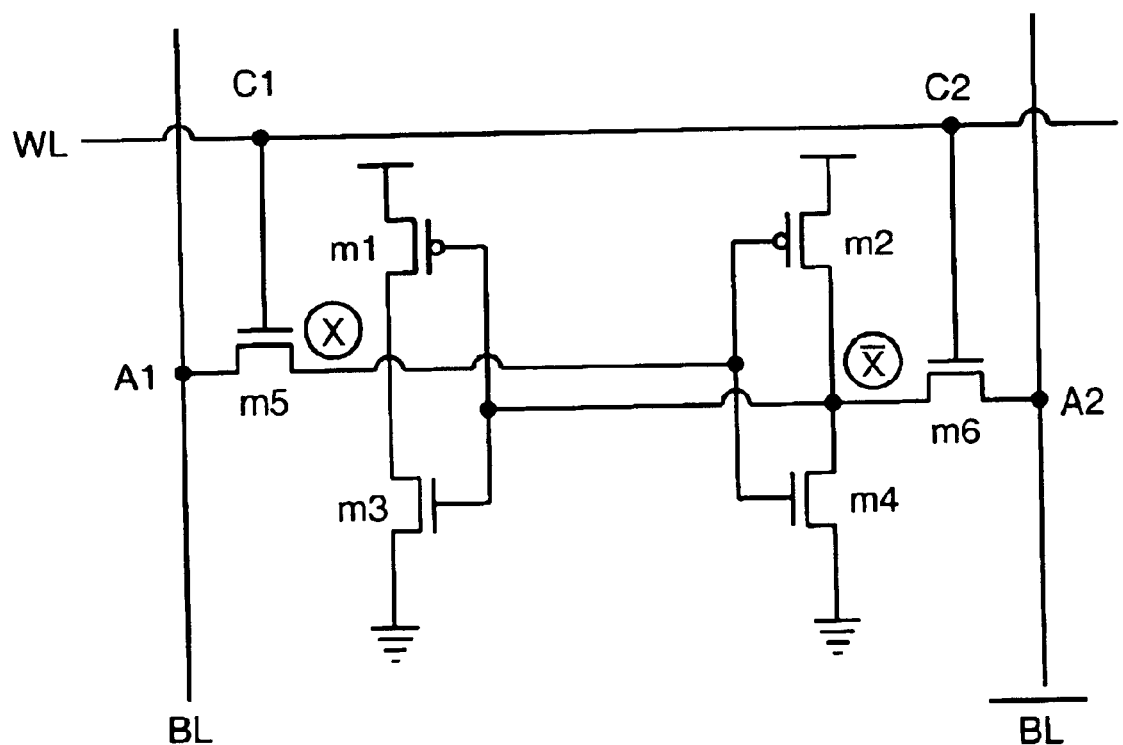
FIG._1A
*(PRIOR ART)*

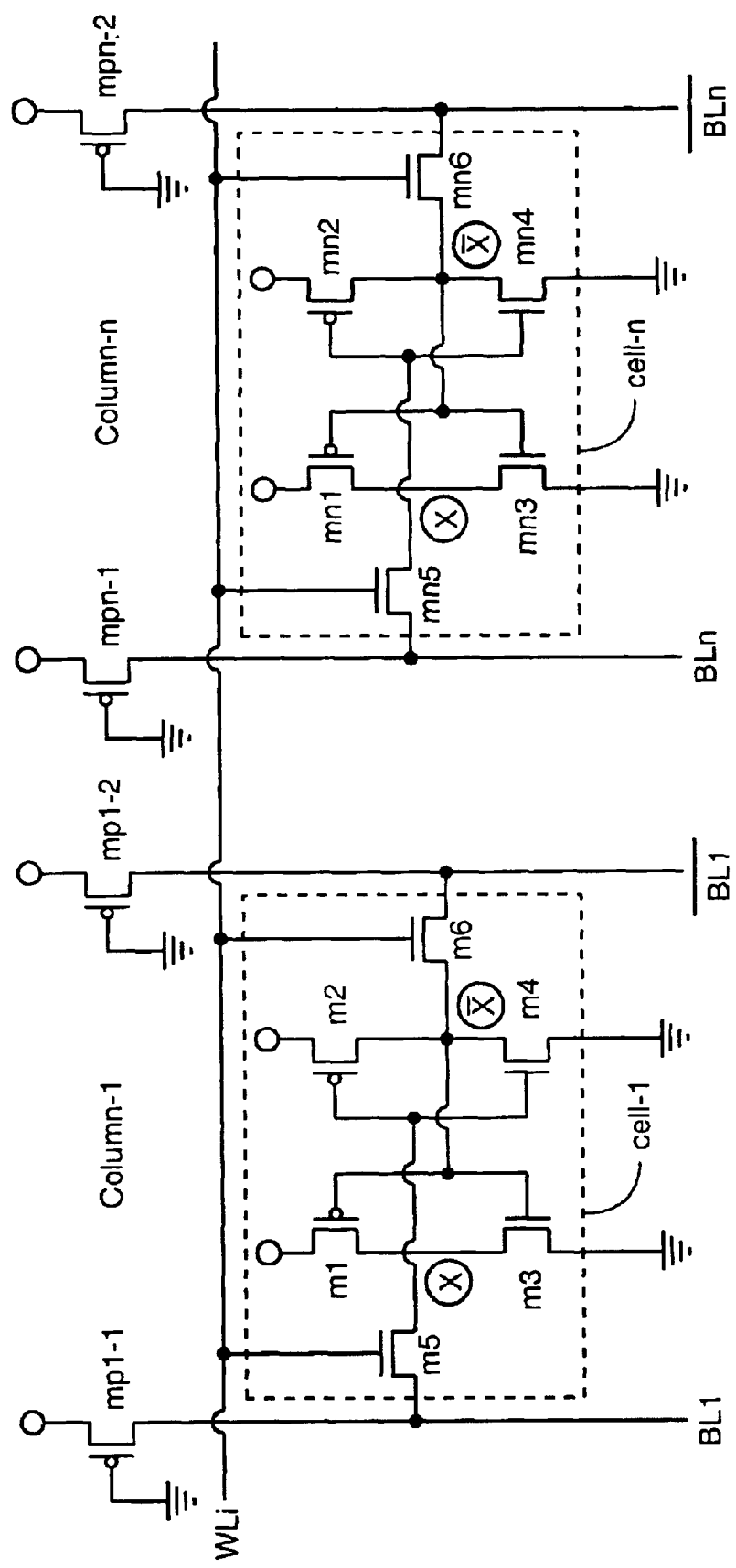
FIG._1B *(PRIOR ART)*

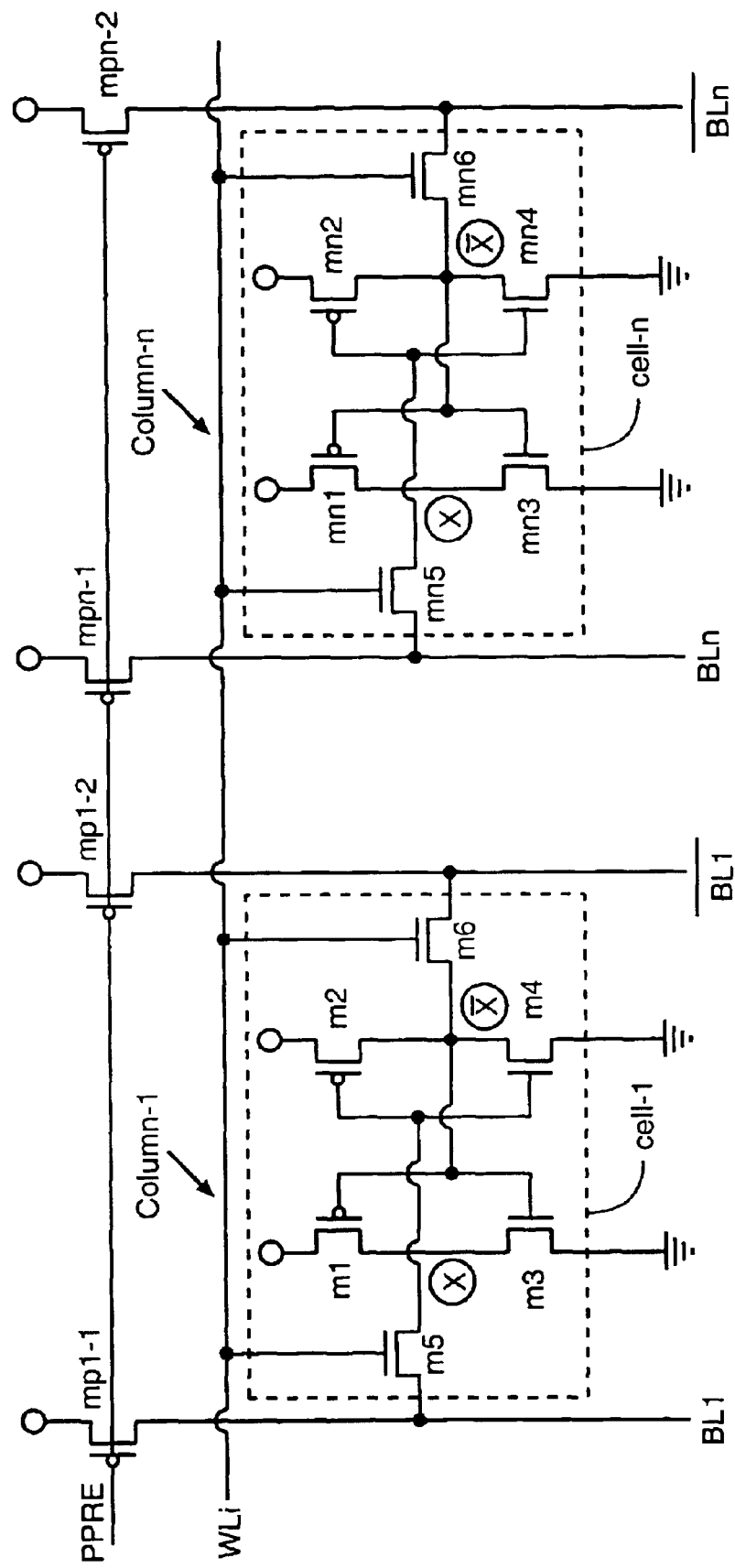
FIG._1C (PRIOR ART)

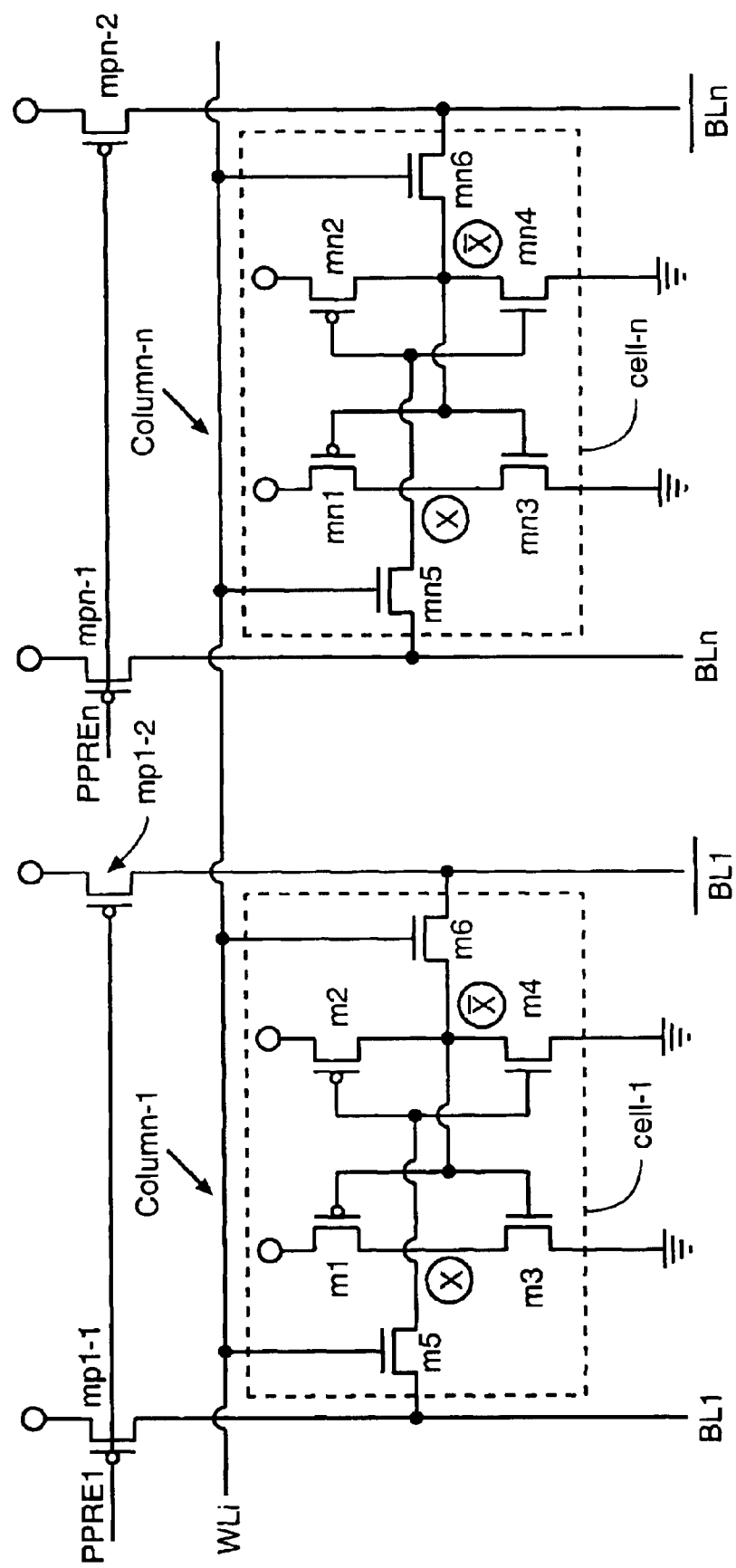
FIG._1D (PRIOR ART)

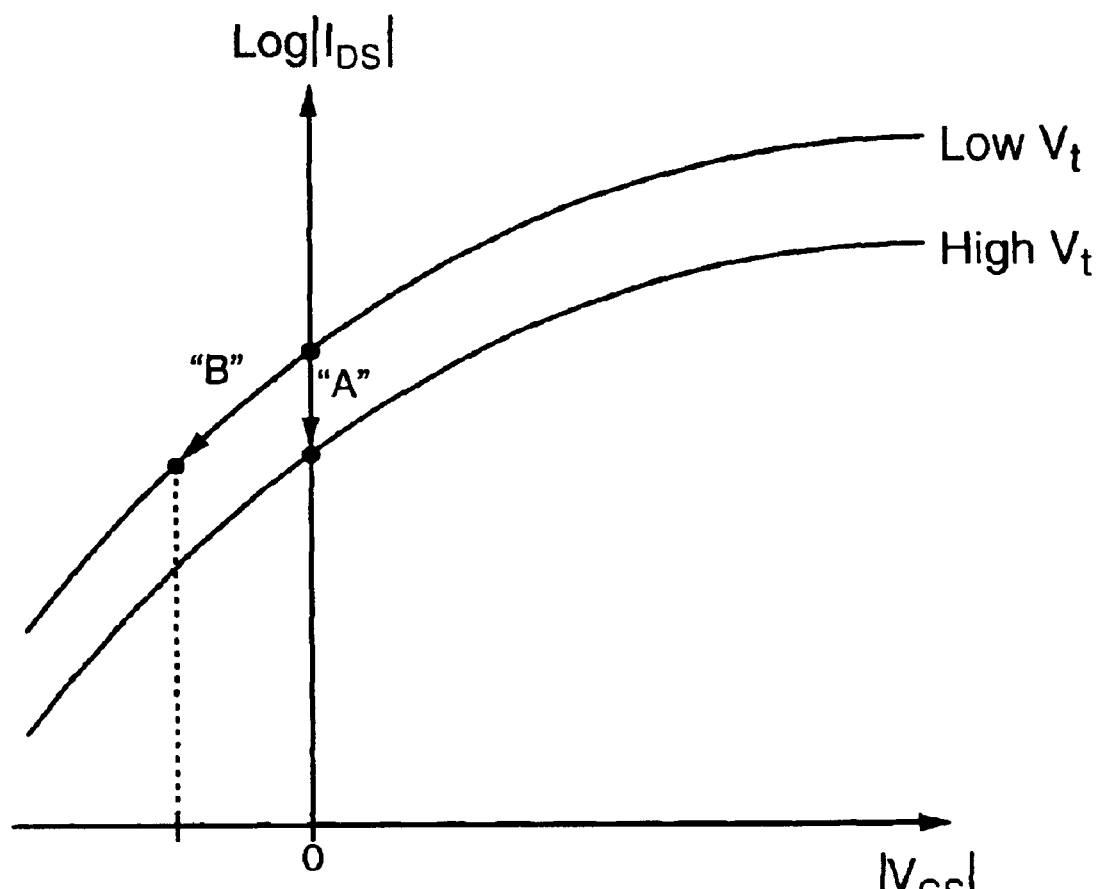
FIG._2
*(PRIOR ART)*

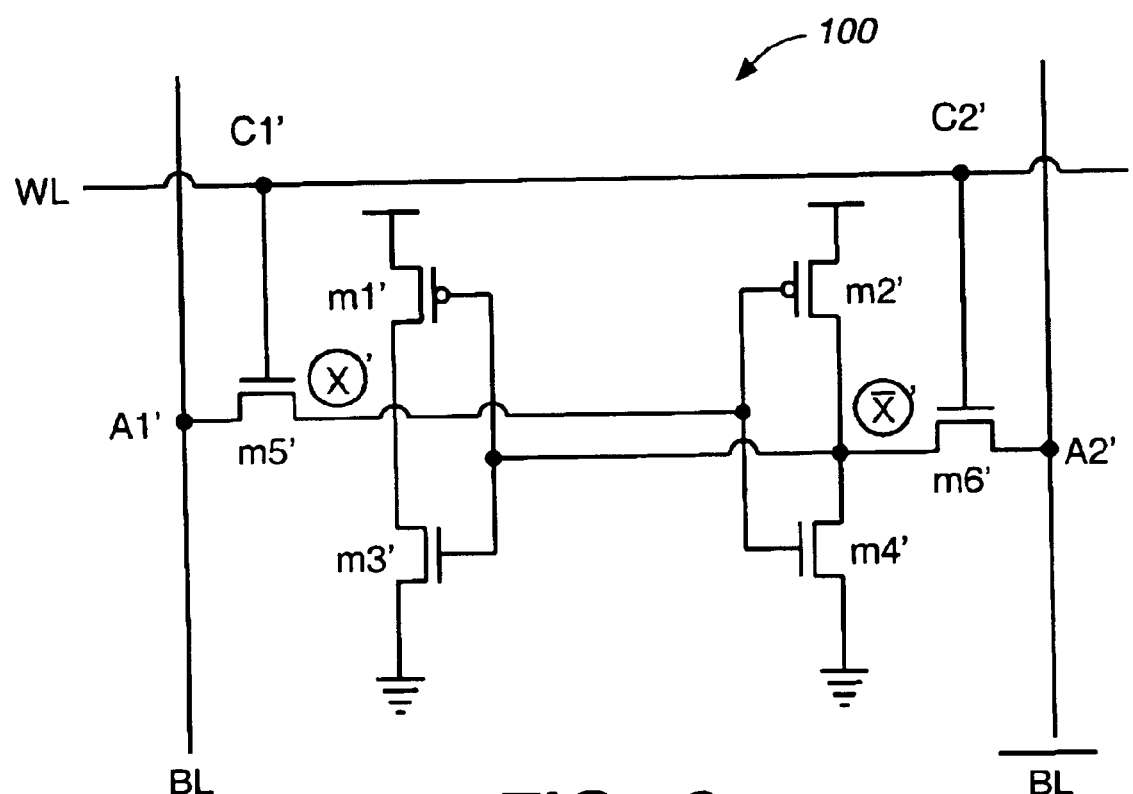
FIG._3

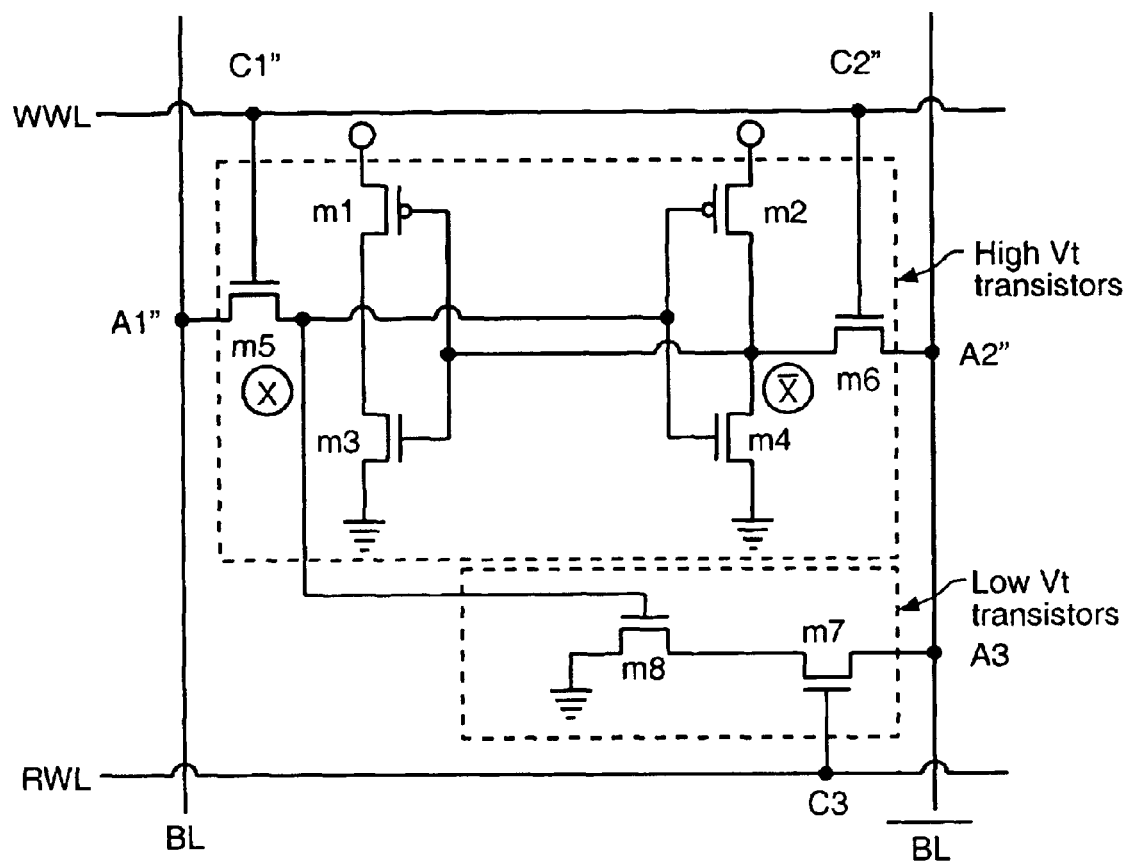
FIG._4A

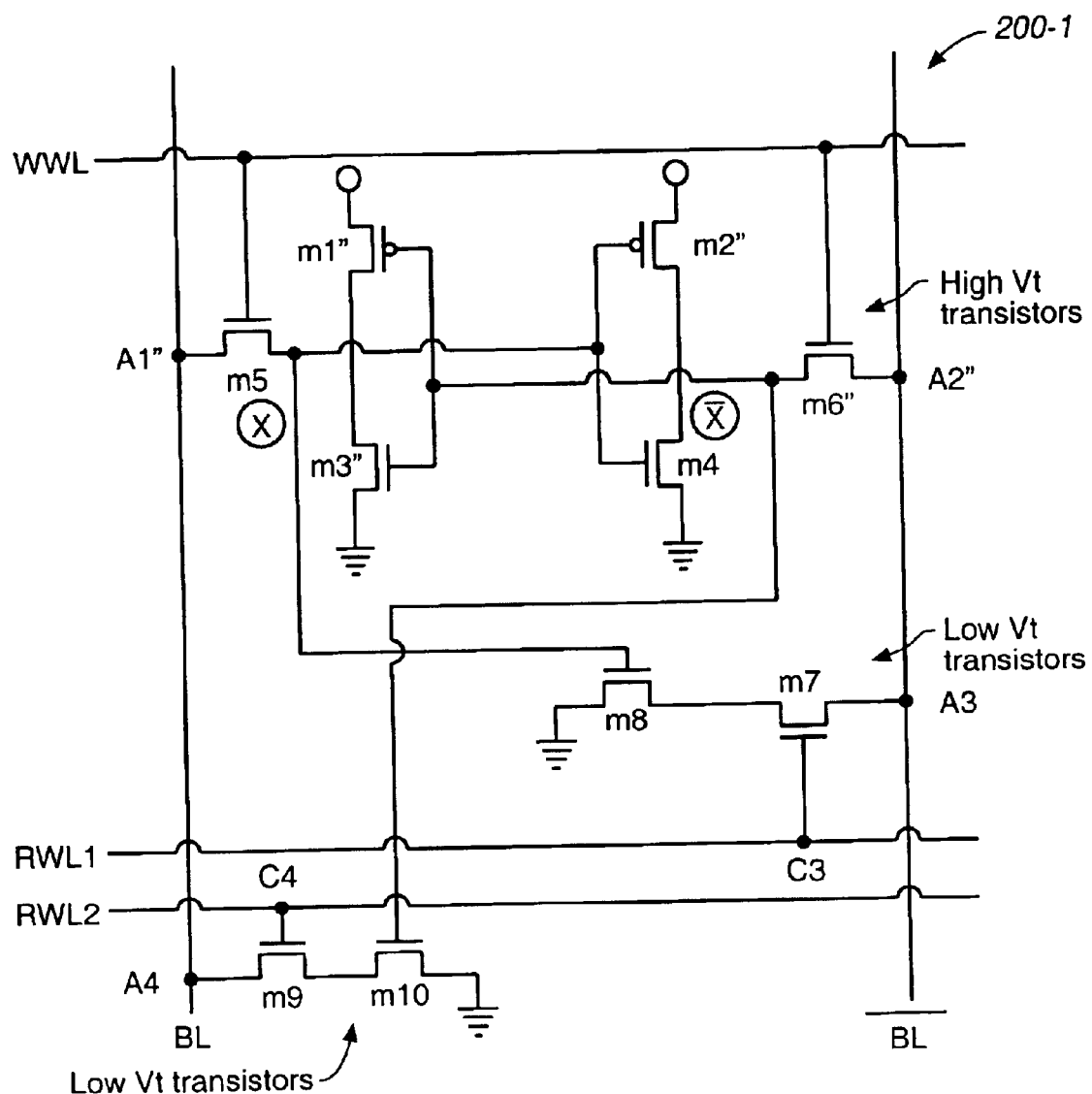
FIG._4B

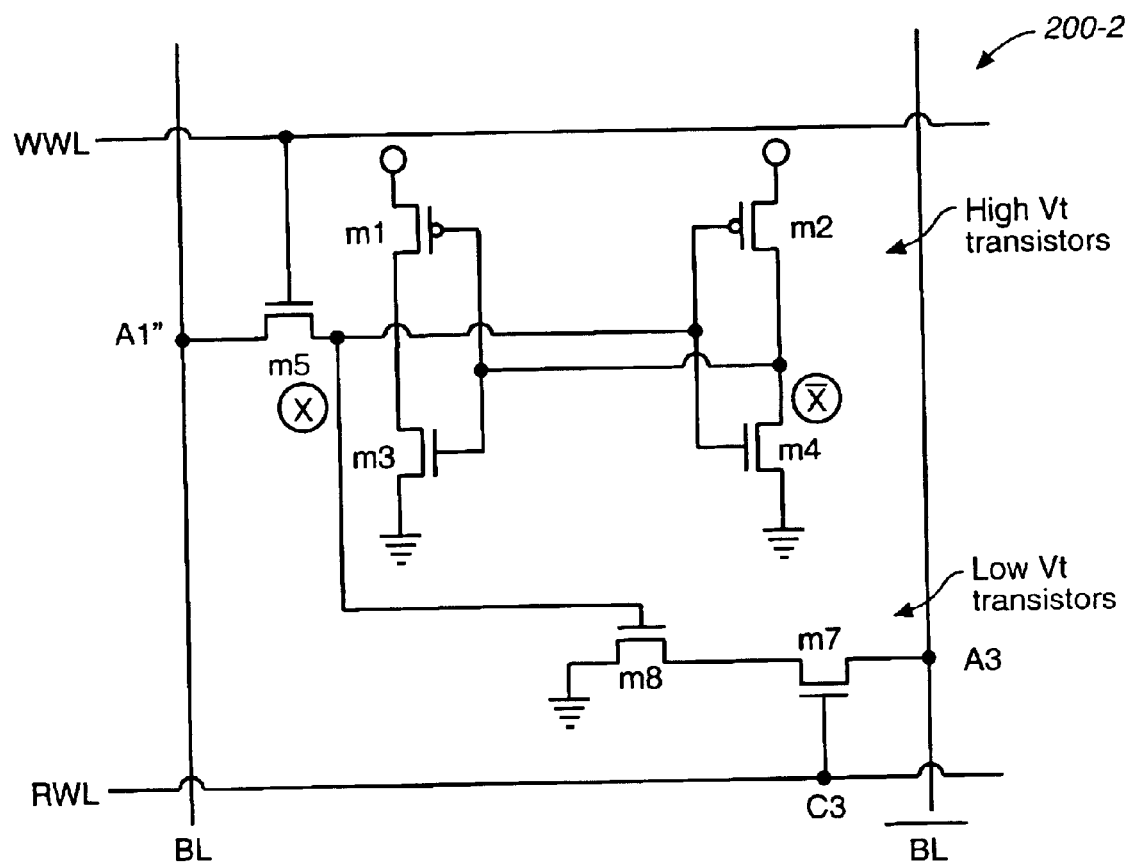
FIG._4C

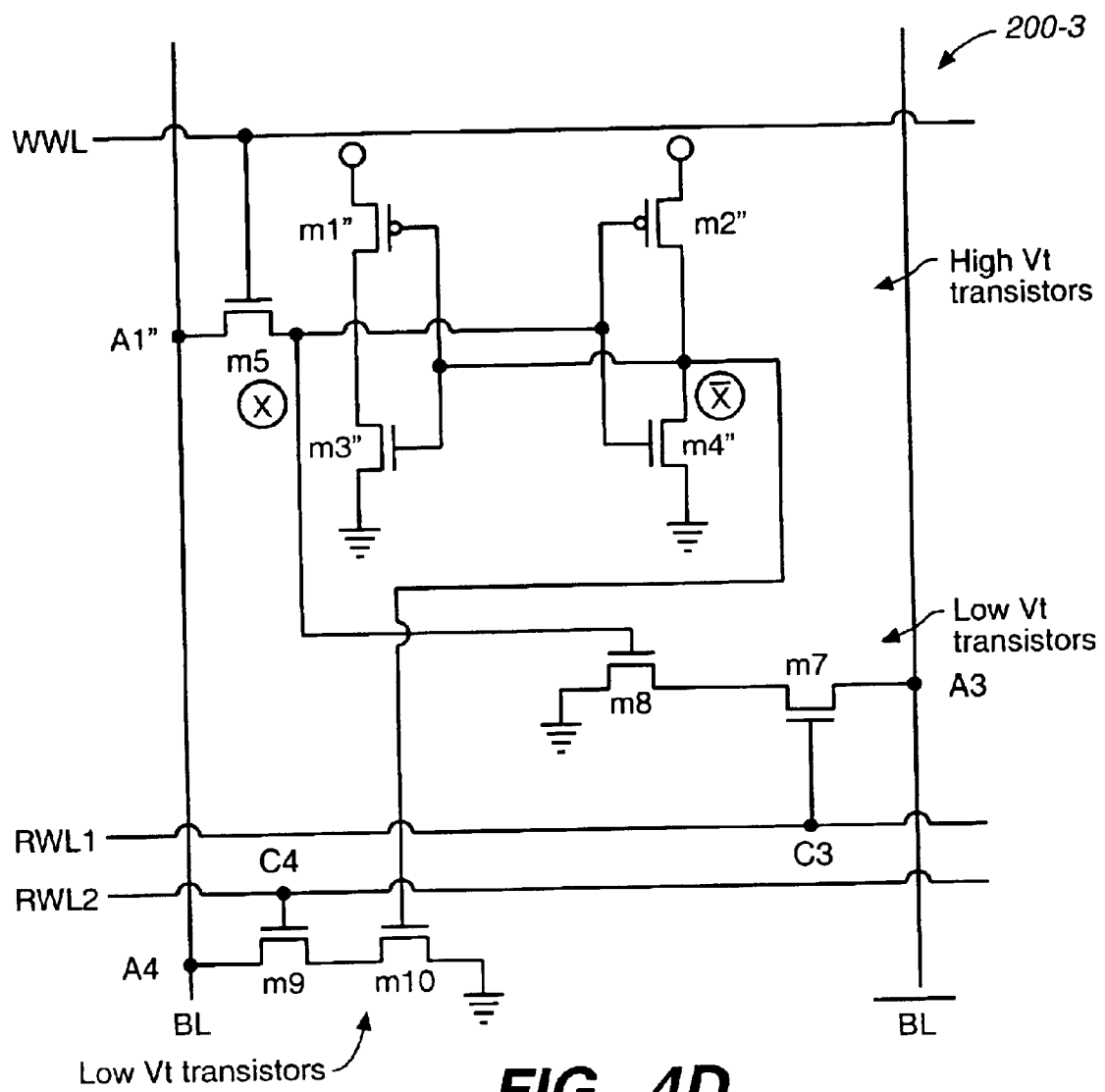
FIG._4D

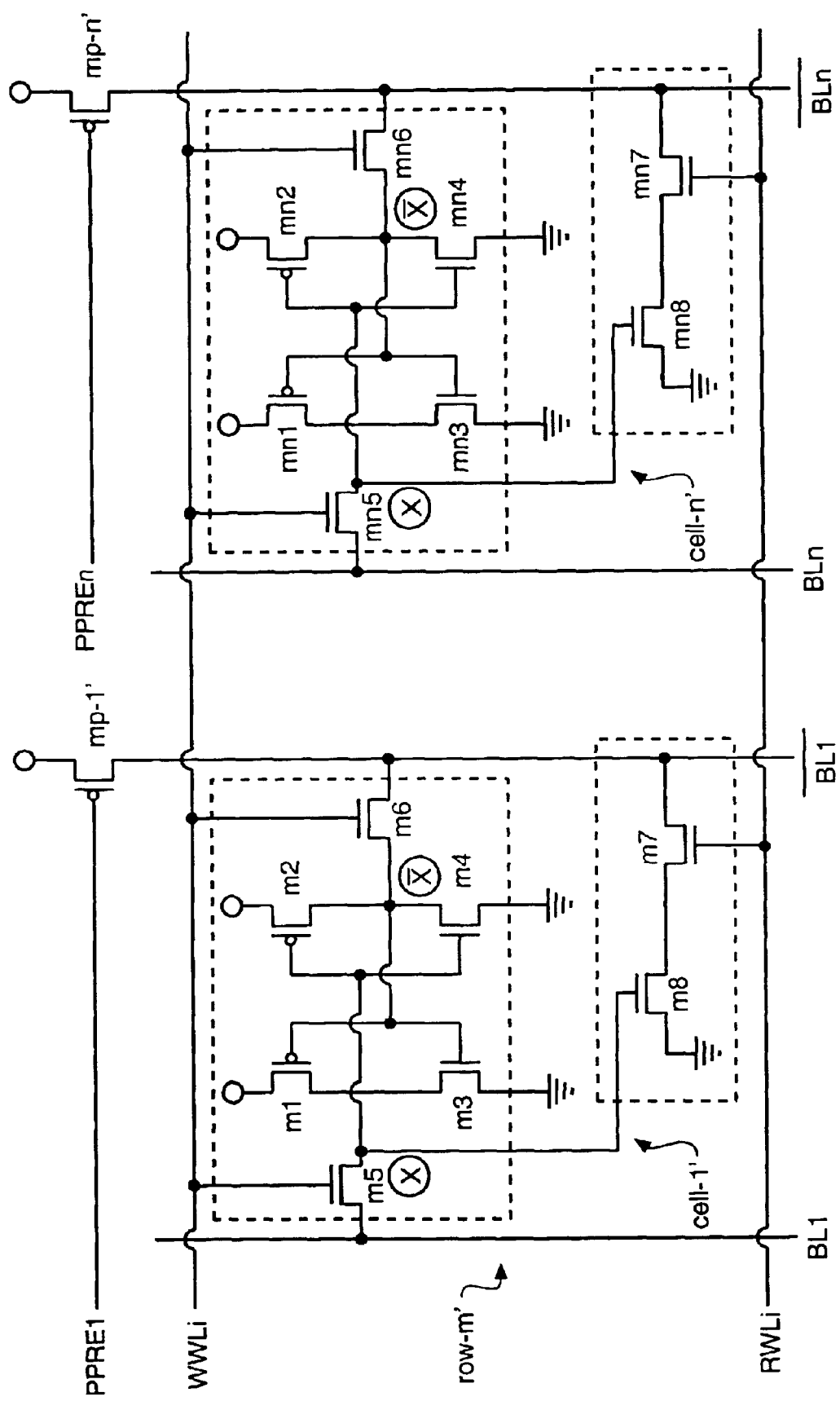
FIG._4F

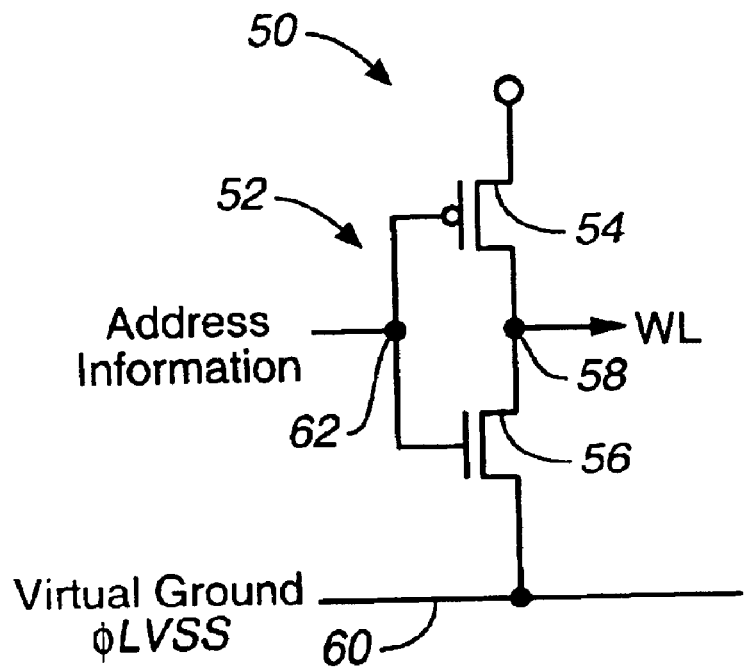
FIG._5A
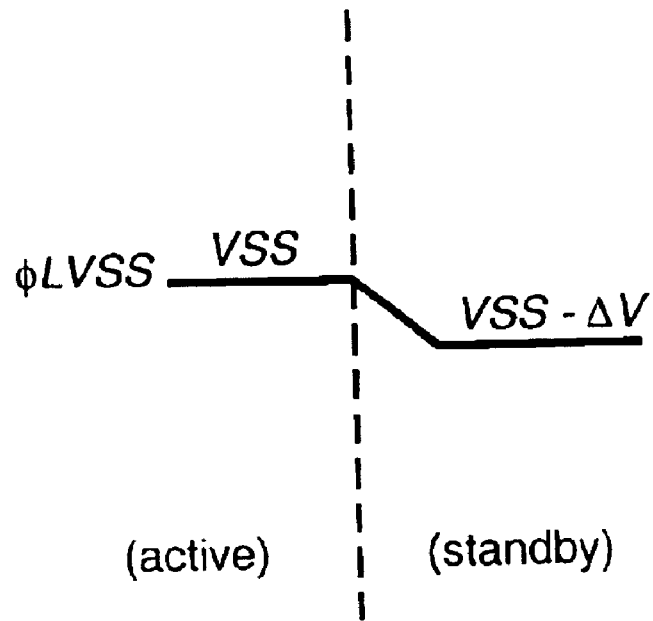
FIG._5B

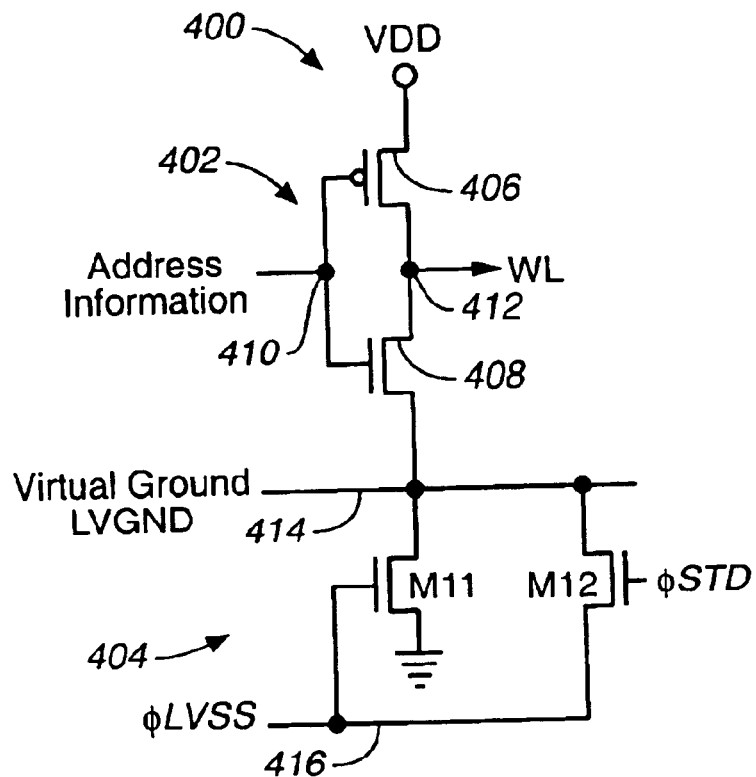
FIG._6A
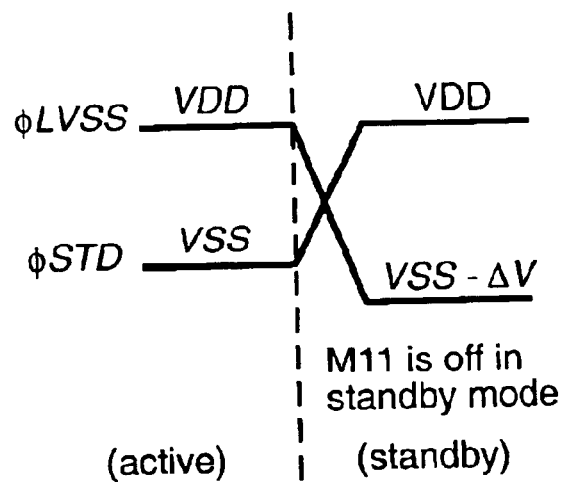
FIG._6B

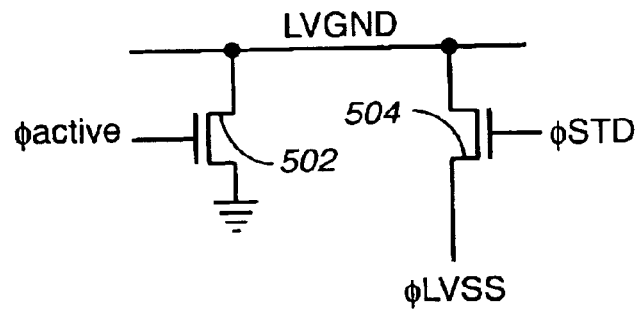
FIG._7A
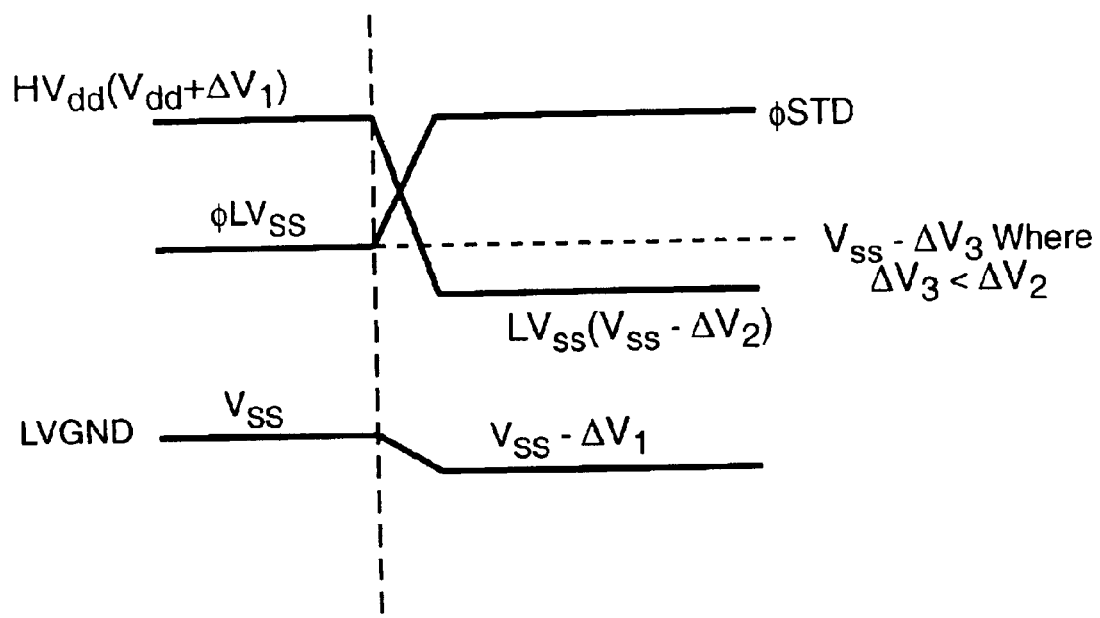
FIG._7B

LOW-POWER HIGH-PERFORMANCE STORAGE CIRCUITRY

CROSS-REFERENCE TO RELATED APPLICATIONS

This application claims priority to and the benefit of the filing date of provisional patent application Ser. No. 60/368,392 filed Mar. 27, 2002.

BACKGROUND OF THE INVENTION

1. Field of the Invention

The invention relates to integrated circuits, and more particularly, to integrated circuits used in information storage and retrieval.

2. Description of the Related Art

For over three decades the semiconductor industry has been able to take advantage of the technology scaling according to Moore's Law. A continual increase in memory chip density, and thus the on-chip memory capacity has enabled the development of new products such as portable electronic devices used for mobile computing and communications. Without high-density memory it would not have been possible to have devices such as cell phones, personal digital assistants (PDAs), palm-top computers, or even lap-top computers. Power Consumption has become a significant factor in use of such portable devices. Power Consumption affects battery life, and lower power consumption leads to longer battery life. Static Random Access Memory (SRAM), has been an important component of portable devices since it consumes less power and is generally faster than dynamic RAM (DRAM) that requires periodic refresh operation to prevent loss of memory contents. Currently 16 Mb SRAMs and 256 Mb DRAMs are available on the market.

For portable device applications that require SRAM, low standby current is highly desirable so as to extend the battery lifetime. Otherwise, rapid depletion of the battery power can limit the use of portable devices and also can inconvenience users of those devices by requiring them to carry spare batteries, for example. In a present generation of portable devices, the typical standby current of a portable device is 5-10 microamperes ($10^{-6}$ A). Ideally, the standby current would be zero, and the less the better. Standby current has several components, and one of the most significant components is due to leakage in memory cells. As the desired memory capacity for portable devices has grown, it is increasingly important to suppress the leakage current. Unfortunately, the leakage current in prior memory circuits tended to increase for each generation of technology scaling according to a physical law. It is well known that the subthreshold current of a Metal-Oxide Semiconductor (MOS) transistor increases exponentially as the device threshold voltage is scaled down as required for chip performance with a downscaled power supply voltage. This leakage current phenomenon in an MOS transistor is described generally in the following equation:

$$I_{leakage} = K^* \exp((Vgs-Vt)/(S/\ln 10))(1-\exp(-Vds/V_T)) \quad (1)$$

where K is a constant that depends on the technology, Vgs is the gate-to-source voltage (=Vg−Vs), Vt is the device threshold voltage, S is the subthreshold voltage swing, $V_T$ is the thermal voltage (=kT/q) with k denoting the Boltzman's constant. S, the subthreshold swing voltage, can be described by $$S=(kT \ln 10)/q^*(1+Cd/Cox) \quad (2)$$

Equation (1) suggests that an increase in Vt can be used to reduce the leakage current, and this approach is practiced reluctantly in VLSI design despite a speed penalty. In other words, increased Vt results in both reduced leakage current and increased signal propagation delay within the circuit. Thus, typically there has been a trade-off between a desire to minimize leakage current and a desire to maximize speed. This trade-off generally has been acceptable as long as reduced leakage current transistors with increased Vt are not in speed-critical paths. Ordinarily, transistors in speed-critical paths should have lower threshold voltages in order to ensure reduced signal propagation delay leading to increased circuit speed. However, lower threshold voltage can result in relatively heavy leakage currents in standby mode.

FIG. 1A is an illustrative circuit diagram of a known integrated circuit data storage cell of the type referred to as an SRAM cell. This prior SRAM cell includes six transistors, two transistors for access (m5, m6) and four transistors (m1, m2, m3, m4) for latching data with two cross-coupled inverters (m1-m3 pair and m2-m4 pair). Transistors m1-m4 serve as storage circuitry. In this example, the storage circuitry operates by latching data. Transistors m5 and m6 serve as access transistors for writing data to and reading data from the storage circuitry. Suppose, for example, that the stored data is logic "1." The data-storing node X is set to high ("1") and the other data-storing node X-bar is set to low ("0"). Therefore, transistors m1 and m4 are turned on while transistors m2 and m3 are turned off. Access transistors, m5 and m6, are turned on by driving wordline (WL) high and are turned off by driving wordline (WL) low. When m5 and m6 are turned on, BL is linked to node X and BL-bar is linked to X-bar.

More specifically, the integrated circuit data storage cell includes a latch circuit including first and second inverters. A first inverter includes a first high threshold voltage PMOS transistor m1 and a first high threshold voltage NMOS transistor m3 and a first data node X comprising interconnected source/drains (S/D) of the first PMOS m1 and NMOS m3 transistors. A second inverter includes a second high threshold voltage PMOS transistor m2 and a second high threshold voltage NMOS transistor m4 with a second data node X-bar comprising interconnected source/drains (S/D) of the second PMOS transistor m2 and NMOS m4 transistor. The gates of the first PMOS transistor m1 and first NMOS transistor m3 are coupled to the second data node X-bar. The gates of the second PMOS transistor m2 and the second NMOS transistor m4 are coupled to the first data node X. A first low threshold voltage access transistor m5 includes a first S/D coupled to the first data node X and to the gate of the second PMOS transistor m2 and to the gate of the second NMOS transistor m4 and includes a second S/D coupled to a first data access node A1 and includes a gate coupled to a first access control node C1. A second low threshold voltage access transistor m6 includes a first S/D coupled to the second data node X-bar and to the gate of the first PMOS transistor m1 and to the gate of the first NMOS transistor m3 and includes a second S/D coupled to a second data access node A2 and includes a gate coupled to a second access control node C2.

During a write operation, for example, when WL is high, data "1" on BL can be fed to node X by turning on access transistor m5, and at the same time, data "0" on BL-bar can be fed to node X-bar by turning on access transistor m6. The latching by m1-m3 and m2-m4 pairs enable stable storage of data "1" at node X even after the access transistors m5 and m6 are turned off with low voltage on WL line. Conversely, data "0" can be written to node X by providing logic "0" on BL while providing logic "1" on BL-bar when access transistors m5 and m6 are turned on by a high WL signal.

Conversely, during a read operation, both BL and BL-bar are pre-charged to a high voltage level, e.g., $V_{DD}$. If the voltage level at node X-bar is low, then the voltage on BL-bar will discharge through m4. If the voltage level at node X-bar is high, then the voltage on BL-bar will not discharge through m4. Instead, the voltage of BL will discharge through m3. A sense amplifier (not shown) can sense a small voltage drop on either BL or BL-bar so as to determine the voltage level stored at nodes X and X-bar and generate an output signal, e.g. high when the stored data is high or low when the stored data is low.

Unfortunately, there have been reliability problems with this earlier SRAM cell. For instance, if m3 is leaky and conducts current from node X to ground, then the charge stored at that node can be reduced, pulling down the node voltage at X, which in turn can make m2 leak some charge into node X-bar. Voltage build up at node X-bar can in turn promote more leakage current through m3 potentially causing a transition to a new erroneous locked state. Thus, current leakage can result in reliability problems by causing erroneous data storage.

Another problem with the prior SRAM structure of FIG. 1A is that the voltage of a cell node can be influenced by bit line voltages during a read operation. For example, assume that the voltages of X and X-bar are high and low respectively, and BL and BL-bar are precharged at $V_{DD}$. When WL is enabled, m5 and m6 become to turned on. Node X at the junction of m1 and m3 is coupled to BL, and node X-bar at the junction of m2 and m4 is coupled to BL-bar. Since BL-bar is precharged to $V_{DD}$ and the level of X-bar is low (e.g., $V_{SS}$), the voltage level on BL-bar can influence the voltage level at node X-bar. One approach to reducing the influence that the voltage on BL-bar has on node X-bar is to increase the impedance of m6. However, increasing the impedance of m6 also slows down the read speed. Thus, there is a tradeoff between circuit stability and read speed.

In addition, leakage currents in standby mode can cause draining of the battery. FIG. 2 is an illustrative drawing of an I-V characteristics of a MOS transistor for two different threshold voltages (low Vt and high Vt). As explained by equation (1), the higher the threshold voltage, the lower the leakage current (Ids) in magnitude. Thus, design option "A" would use high Vt to lower the leakage current, but this would cause speed degradation since the signal propagation delay increases as Vt increases for a fixed Vgs ($<V_{DD}$) swing. It is known that the propagation delay driven by a MOS transistor is inversely proportional to (Vgs–Vt). Thus, for a given Vgs, there is more delay at higher Vt. By comparison, design option "B" would use low Vt to increase speed by reducing signal propagation delay but leakage current can be reduced by making the transistor reverse-biased when the transistor is turned-off.

Although, the fact that leakage current can be reduced when a transistor is reversed-biased has been known, there still exists a need for an integrated circuit data storage cell that suppresses leakage current without performance degradation and reliability issues. In particular, there has been a need for an SRAM cell that reduces power consumption without sacrificing high speed performance.

There also has been a need for increased memory capacity within a given chip area. In order to store more information within a given area of a chip, the individual storage cell area should be small. For this reason, in the past, layout experts often did data storage cell layout manually. Even a tiny saving in the unit cell area can lead to significantly increased storage capacity within an overall chip area, especially when many data storage cells are used repeatedly on a chip. One approach that has been considered for increasing information storage capacity is to store more than one bit of data in a single memory cell. If two data bits can be stored in one unit cell, then effectively the memory capacity can be doubled for the same chip area. Moreover, the chip area for a given data storage capacity could be reduced, thus increasing the production yield. There has been a need for a memory cell architecture that allows a simple approach to implementing multiple-bit storage in a single memory cell.

In addition, there has existed a need to reduce power consumption due to precharging of bit lines for read operations and to reduce chip area occupied by precharge circuitry. FIGS. 1B–1D are illustrative circuit diagrams of showing the known cell of FIG. 1A coupled in a typical SRAM array structure in which each array has m-rows (WL) and n-columns (BL and BL-bar) of cells. Each column includes a bit line pair BL and BL-bar. Each array of FIGS. 1B–1D has a different known precharge circuitry configuration. More particularly, FIGS. 1B–1D show a first cell, cell-1 in a first column-1 and a last cell, cell-n of a last column-n of row m. Specifically, cell-1 and cell-n include respective input transistors m5 and m6 with gates coupled to WLm. Respective S/D terminals of m5 and m6 input transistors of cell-1 are respectively coupled to BL1 and BL1-bar. Respective S/D terminals of m5 and m6 input transistors are respectively coupled to BLn and BLn-bar.

FIG. 1B shows a first precharge circuitry configuration in which, at the end of each bit line, a precharge transistor, e.g., PMOS transistors mp1-1, mp1-2 mpn-1 and mpn-2, is placed to set the bit line (BL) and bit line bar (BL-bar) voltages at a certain level. For example, the notation "mp1-1" indicates, row-m, precharge, column-1, coupled to first bit line (BL1) of cell. For example, the notation "mpn-2" indicates, row-m, precharge, column-n, coupled to second bit line (BLn-bar) of the cell.

In the precharge circuitry configuration of FIG. 1B, all BL lines and all BL-bar lines are precharged to $V_{DD}$ through mp1-1, mp1-2, mpn-1 and mpn-2. The gates of these transistors are coupled to a power supply level, e.g., $V_{SS}$ in this example, and thus, the precharge transistors are always turned on, and the BL lines and BL-bar lines are continually precharged to $V_{DD}$.

FIG. 1C shows a second precharge circuitry configuration similar to that of FIG. 1B. However in the configuration of FIG. 1C the precharge transistors are controlled by a precharge control signal PPRE.

FIG. 1D shows a third precharge circuitry configuration in which each bit line pair has a dedicated control signal, e.g., PPRE1 for BL1 and BL1-bar and PPREn for BLn and BLn-bar. These dedicated control signals permit selective precharging of bit pairs. Selective precharging can reduce power consumption since current paths not involved in a read operation are not unnecessarily precharged. Moreover, cells in a given SRAM array can be divided into groups, and different respective precharge signals can be used to control precharging of different respective groups of cells. For example, assuming that there are 128 cells in an SRAM array, and that only 16 bits of cell data are read at a time, then the cells of the array can be divided into 8 groups, and each group can have a different precharge control signal.

While a precharge circuitry configuration such as that of FIG. 1D can reduce precharge-related power consumption, there has existed a need for further improvements in precharge-related power consumption and for precharge circuitry that occupies less chip area.

The present invention meets these needs.

SUMMARY OF THE INVENTION

One aspect of the invention provides an improved integrated circuit which includes a storage cell comprising higher threshold voltage transistors and which includes one or more lower threshold voltage access transistors.

Another aspect of the invention provides an improved integrated circuit storage cell with separate write path and read path.

Another aspect of the invention provides an integrated circuit storage cell with an improved precharge circuitry configuration.

These and other features and advantages of the invention will be appreciated from the following detailed description of embodiments of the invention and through reference to the illustrative drawings.

BRIEF DESCRIPTION OF THE DRAWINGS

FIG. 1A is an illustrative circuit diagram of a known integrated circuit data storage cell of the type generally referred to as an SRAM cell.

FIGS. 1B–1D are three illustrative circuit diagrams of the known cell of FIG. 1A in a typical SRAM array structure with three different precharge circuitry configurations.

FIG. 2 is an illustrative drawing of an I-V characteristics of a MOS transistor for two different threshold voltages (low Vt and high Vt).

FIG. 3 is an illustrative circuit diagram of an integrated circuit data storage cell in accordance with a first embodiment of the invention.

FIGS. 4A–4D are illustrative circuit diagrams of second through fifth embodiments of the invention; and FIGS. 4E–4F are illustrative drawings of precharge circuitry configurations for cells of the type in FIGS. 4A–4D in accordance with embodiments of the invention.

FIG. 5A is an illustrative drawing of a conventional word line driver circuit that can be used with data storage cell circuitry of embodiments of the present invention.

FIG. 5B is an illustrative drawing of a virtual ground signal applied to the driver of FIG. 5A during active and standby modes of operation.

FIG. 6A is a circuit diagram of a word line driver circuit in accordance with one aspect of the invention.

FIG. 6B is a signal diagram used to explain the operation of the word line driver circuit of FIG. 6A in active and standby modes.

FIG. 7A shows an alternative embodiment of only a bias circuitry portion word line driver circuit in accordance with one aspect of the invention.

FIG. 7B is a signal diagram used to explain the operation of the bias circuitry of FIG. 7A.

DETAILED DESCRIPTION OF THE PREFERRED EMBODIMENT

Figure 4E:
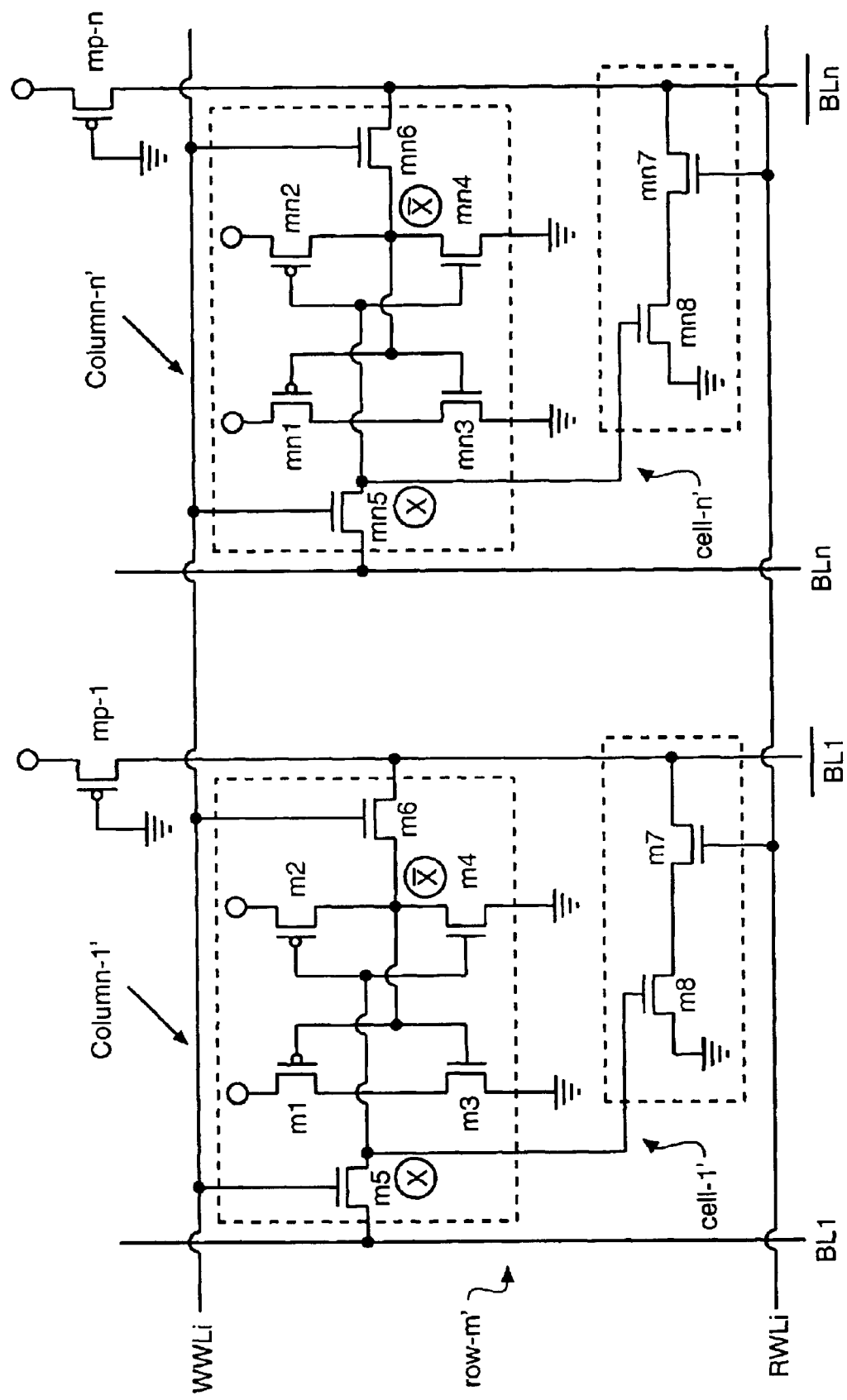

The present invention provides novel integrated circuitry that can exhibit high-performance (high-speed) operation in an active mode, can significantly suppress subthreshold leakage current in a standby mode, and can operate with a relatively low (less than 1V) supply voltage. The following description is presented to enable any person skilled in the art to make and use the invention. The embodiments of the invention are described in the context of particular applications and their requirements. These descriptions of specific applications are provided only as examples. Various modifications to the preferred embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

FIG. 3 is an illustrative circuit diagram of an integrated circuit data storage cell 100 in accordance with a first embodiment of the invention. The topology and overall operation of the inventive data storage cell 100 of FIG. 3 is like that of the earlier SRAM cell of FIG. 1A. Transistors shown in FIG. 3 that correspond to transistors of FIG. 1A are labeled with reference numerals that are identical to the reference numerals used in FIG. 1A and that are primed. Therefore, reference can be made to the above description of the prior SRAM cell of FIG. 1A to understand the structure and operation of the new data storage cell of FIG. 3.

There are important differences between the novel data storage cell 100 of FIG. 3 and the earlier SRAM cell of FIG. 1A. First, the data latching transistors (m1'-m4') of the novel data storage cell 100 are implemented as high threshold voltage (high Vt) transistors. Second, the access transistors (m5'-m6') of the novel storage cell 100 are implemented as low threshold voltage (low Vt) transistors. A transistor can be classified as a high or low Vt transistor based upon its threshold voltage relative to the threshold voltages of other transistors in the same chip. The threshold voltage is determined by the combination of physical parameters of transistors such as substrate doping concentration, oxide thickness, gate width, etc. The use of high Vt transistors in the novel data storage cell 100 to implement the storage circuitry used to latch data reduces the leakage current. The use of low Vt transistors in the new SRAM cell 100 to implement the access transistors promotes fast data read cycles and fast data write cycles. Thus, the data storage cell 100 shown in FIG. 3 advantageously provides reduced leakage current while sacrificing little if any reduction in write access speed or read access speed.

FIG. 4A is an illustrative circuit diagram of an integrated circuit data storage cell 200 in accordance with a second embodiment of the invention. Some portions of the topology and operation of the inventive data storage cell 200 of FIG. 4A are identical to corresponding portions of the novel data storage cell 100 of FIG. 3. Transistors shown in FIG. 4A that correspond to transistors of FIG. 3 are labeled with reference numerals that are identical to the reference numerals used in FIG. 3 and that are double primed.

The data storage cell 200 includes three sections. A storage circuitry section includes transistors m1"-m4". A write access circuitry section includes transistors m5" and m6". A read access circuitry section includes transistors m7 and m8. Storage transistors m1"-m4" and write access transistors m5"-m6" are high Vt transistors. Read access transistors m7-m8 are low Vt transistors. Leakage current is reduced through the use of high Vt transistors in the storage circuitry section and in the write access circuitry section. Read access time is reduced through the use of low Vt transistors in the read access circuitry section.

The storage circuitry section includes transistors m1"-m4" coupled as shown to operate as a latch circuit just like the corresponding transistors of FIG. 3. When node X is latched at a high voltage level, node X-bar is latched at a low voltage level. Conversely, when node X is latched at a low voltage level, node X-bar is latched at a high voltage level.

The write circuitry section includes transistor m5". Transistor m5" has one source/drain (S/D) terminal coupled to first access node A1" of bit line (BL). Transistor m5" has another S/D terminal coupled to a first data node at a junction of transistors m1" and m3" and to the gates of transistors m2" and m4". Transistor m5" has a gate coupled to a first control node C1" of write word line (WWL) which provides a write control signal that controls the turn-on of transistor m5".

The write circuitry section also includes transistor m6". Transistor m6" has one source/drain (S/D) terminal coupled to second access node A2" of bit line bar (BL-bar). Transistor m6" has another S/D terminal coupled to a second data node at a junction of transistors m2" and m4" and to the gates of transistors m1"and m3". Transistor m6" has a gate coupled to second control node C2" of the write word line (WWL) which provides the write control signal that controls the turn-on of transistor m6".

During a write operation, a storage value represented by the complementary voltage levels on the BL and BL-bar lines is latched into the storage circuitry section. More specifically, a write control signal is provided on the WWL line that simultaneously turns on m5" and m6". The write word line (WWL) has the first and second control nodes in common. With m5" turned on, the voltage on BL is provided to the junction of m1" and m3", and to the gates of m2" and m4". With m6" turned on, the voltage on BL-bar is provided to the junction of m2" and m4", and to the gates of m1" and m3". For example, provision of a high voltage level on BL and low voltage level on BL-bar causes latching of a high voltage level at the junction of transistors m1" and m3" and a low voltage level at the junction of m2" and m4". Conversely, for example, provision of a low voltage level on BL and high voltage level on BL-bar causes latching of a low voltage level at the junction of transistors m1" and m3" and a high voltage level at the junction of m2" and m4". During write operation, a read control signal provided on a read word line RWL maintains transistor m7 in a turned off state.

The read circuitry section includes first and second output transistors m7 and m8. An S/D terminal of m7 is coupled to a third access node A3 of BL-bar line. Another S/D terminal of m7 is coupled to one S/D terminal of m8. A gate of m7 is coupled to a third control node C3 of RWL which provides a read control signal that controls turn-on of m7. Another S/D terminal of m8 is coupled to effective ground potential. A gate of m8 is coupled to first data node X which is at a voltage potential of the junction of transistors m1" and m3".

During a read operation, a read control signal provided on RWL turns on m7. Meanwhile, a write control signal on WWL maintains m5" and m6" in a turned off state. Preparatory to the read operation, BL-bar is precharged to a prescribed precharge level (typically "high", i.e., VDD). A control signal on read control line RWL turns on transistor m7. If the voltage level latched at node X is high, then m8 also turns on, and the precharge voltage on BL-bar discharges to ground through access node A3 and m7 and m8. Thus, transistors m7 and m8 comprise a discharge path. If the voltage level on at node X is low, then m8 does not turn on, a pre-charge voltage on BL-bar does not discharge through m7 and m8. Since m7 and m8 are low Vt devices, the discharging speed is more rapid than it would be if they were high Vt devices. A sense amplifier circuit (not shown) can determine whether or not BL-bar has discharged and thereby ascertain the voltage level stored at node X.

In the embodiment of FIG. 4A, read circuitry operates by having a node X voltage applied to a gate of m8. Also, during a read operation, node X is isolated from BL since m5" is turned off. Thus, there is no need to precharge BL during a read operation. The voltage level at node X is sufficient to control turn-on and tun-off of m8. It will be appreciated that read circuitry could be similarly implemented using node X-bar voltage level and by coupling m7 and m8 in an analogous manner to BL.

The data storage cell circuitry 200 provides a write circuitry path that is separate from the read circuitry path. For example, a write operation involving a transition from a high voltage level to a low voltage level at node X results from discharge of a voltage on BL through an NMOS transistor of a write driver (not shown). Conversely, for example, a write operation involving a transition from a high voltage level to a low voltage level at node X-bar results in discharge of a voltage on BL-bar on a write discharge path through an NMOS transistor of a write driver (not shown). That is, BL or BL-bar is discharged by the driver, and the stored cell data is changed according to the voltage level on BL and BL-bar as explained above. In contrast, a read operation involving a high voltage level on node X results in a discharge of BL-bar on a read discharge path through m7 and m8. Conversely, a read operation involving a low voltage level on node X results in no discharge through m7 and m8.

One benefit of this separation of write and read discharge paths is improved circuit stability since voltage levels on the BL and BL-bar do not influence voltages on X or X-bar during read operations. Moreover, since instability due to bit line voltage levels is removed, m7 and m8 can be implemented using low Vt devices. That is, read speed can be enhanced through the use of lower Vt devices without incurring unwanted circuit stability problems.

Alternatively, read speed can be enhanced by using larger transistors, with larger current carrying capability, to implement m7 and m8. In a circuit topology like that of FIG. 1A, for example, since transistors m5 and m6 are used both for read and write operation at the same time, there is a trade-off between read speed and stability. When the size of m5 and m6 is increased in such earlier circuit topology, read operation can be improved due to its large conductance, but there is a trade-off in that the voltages on BL or BL-bar can have a larger destabilizing influence on the storage node. In such earlier topology, the leakage current from BL or BL-bar line to the storage cell is definitely increased due to its larger size.

In contrast, in the embodiment of FIG. 4A, m5" and m6" do not need to have increased size to improve speed. Typically, write operation speed is made fast by writing data into the cell using relatively big write drivers to pull up or pull down BL or BL-bar line. Since the read path is decoupled from the storage circuitry, m7 and m8 transistors can have increased sizes without significant concern about the impact of such size increases upon the influence of BL or BL-bar on the storage cell and leakage current.

In some applications, transistors with different threshold voltages can be used in the storage, write access and read access sections. For example, in one embodiment, storage transistors (m1"to m4") are implemented with the highest threshold voltage since the leakage current problem can be most serious for these transistors which are required to maintain a high or low voltage storage state, write transistors m5" and m6" are implemented with higher threshold voltages than read transistors m7 and m8, since write speed can be enhanced through larger write drivers (not shown) rather than through a lower threshold voltage. Thus, both performance and stability of operation can be improved by using transistors with three different threshold voltages as described. Alternatively, it is possible to implement m5" and m6" as low Vt transistors, although an $LV_{SS}$ might have to be used to ensure adequate turn-off of m5" and m6" while stored data is leached by transistors m1"-m4". Circuitry that can be used to apply an $LV_{SS}$ turn-off voltage to m5" and m6" is described below with reference to FIGS. 5A–5B and FIGS. 6A–6B and FIGS. 7A–7B.

FIG. 4B is an illustrative drawing of a multi-port integrated circuit data storage cell 200-1 in accordance with a third embodiment of the invention. Components of the second and third embodiment cells 200 and 200-1 of FIGS. 4A–4B that are identical are labeled with identical reference numerals. The following description of the third embodiment focuses on features that are different from those described for the second embodiment. The multi-port integrated circuit data storage cell 200-1 includes a storage circuitry section with transistors m1"-m4", write access circuitry with transistors m5" and m6", a first read access circuit section with output transistors m7, m8 and a second read access circuit section with output transistors m9, m10. In one embodiment, storage sections transistors m1"-m4" and write transistors are high Vt transistors. First and second output transistors m7, m8 and third and fourth output transistors m9, m10 are low Vt transistors.

The cell 200-1 of the third embodiment of FIG. 4B differs from the cell 200 of the second embodiment of FIG. 4A in that the third embodiment cell 200-1 includes the second read access section with output transistors m9, m10 as well as an additional (second) read control line, RWL2, which controls turn-on of transistor m9. More particularly, the cell 200-1 includes a first read access section with first and second output transistors m7, m8 coupled just as in FIG. 4A, although a (first) read control line is re-labeled as RWL1 in FIG. 4B. In addition, the second read circuitry section includes third and fourth output transistors m9 and m10. An S/D terminal of m9 is coupled to a fourth access node A4 of BL line. Another S/D terminal of m9 is coupled to one S/D terminal of m10. A gate of m9 is coupled to a fourth control node C4 of RWL2, which provides a read control signal that controls turn-on of m9. Another S/D terminal of m10 is coupled to effective ground potential. A gate of m10 is coupled to second data node X-bar that is at a voltage potential of the junction of transistors m2" and m4".

The write operation and the storage operation of the third embodiment cell 200-1 of FIG. 4B are the same as those of the second embodiment cell 200 of FIG. 4A. Moreover, the read operation of the first access section transistors m7, m8 of FIG. 4B is just like that of the corresponding transistors m7, m8 of FIG. 4A. However, the multi-port integrated circuit data storage cell 200-1 of FIG. 4B advantageously permits multiple simultaneous independent read accesses to cell 200-1.

More specifically, at the same time that cell 200-1 of FIG. 4B is being read via BL-bar through the operation of the first read access section output transistors m7, m8, cell 200-1 also can be read independently via BL through the operation of the second read access section output transistors m9, m10. Preparatory to the read operation, BL and BL-bar are pre-charged to a prescribed precharge level (typically "high", i.e., VDD). A write control signal on WWL maintains m5" and m6" in a turned off state during read access cycles. During a read operation via the first read access section, a read control signal provided on RWL1 turns on m7. If, for example, the voltage level at node X is low, then m8 is off, and BL-bar does not discharge to ground. While the example read access via the first read access section is in progress, the second read control line RWL2 may provide a control signal that turns on m9. Assuming that the voltage level latched at node X-bar is high, then m10 also turns on, and the pre-charge voltage on BL discharges to ground through access node A4 and m9 and m10. Thus, transistors m9 and m10 comprise a discharge path. If on the other hand, RWL2 provides a control signal that turns on m9 when the voltage level on node X is high the and voltage level on node X-bar is low, then m10 does not turn on, and a pre-charge voltage on BL does not discharge through m9 and m10. Since m9 and m10 are low Vt devices, the discharging speed is more rapid than it would be if they were high Vt devices. Sense amplifier circuitry (not shown) can determine whether or not BL and/or BL-bar have discharged and thereby ascertain the voltage levels stored at nodes X and X-bar.

FIG. 4C is an illustrative drawing of an integrated circuit data storage cell 200-2 in accordance with a fourth embodiment of the invention. Components of the second and fourth embodiment cells 200 and 200-2 of FIGS. 4A and 4C that are identical are labeled with identical reference numerals. The following description of the fourth embodiment focuses on features that are different from those described for the second embodiment. An important difference between the cell 200 and cell 200-2 is the presence of only one of the write access transistors in cell 200-2. The use of only one write access transistor in the fourth embodiment cell 200-2 advantageously reduces cell area.

The use of a single access transistor m5" in the cell 200-2 of the fourth embodiment makes for a somewhat different write operation than that of the cell 200 of the second embodiment. Specifically, during a write operation, a storage value represented by the voltage level on the BL line is latched into the storage circuitry section. A write control signal is provided on the WWL line that turns on access transistor m5". With m5" turned on, the voltage on BL is provided to the junction of m1" and m3", and to the gates of m2" and m4". For example, provision of a high voltage level on BL causes latching of a high voltage level at the junction of transistors m1" and m3" and a low voltage level at the junction of m2" and m4". Basically, the high level voltage applied to node X causes m2" to turn off and causes m4" to turn on, which results in node X-bar being pulled down to a low voltage level. The low voltage on node X-bar, in turn, causes m1" to turn on and causes m3" to turn off, which cause node X to be pulled up to a high level. Conversely, for example, provision of a low voltage level on BL causes latching of a low voltage level at the junction of transistors m1" and m3" and a high voltage level at the junction of m2" and m4". In essence, the low level voltage applied to node X causes m2" to turn on and causes m4" to turn off, which results in node X-bar being pulled up to a high voltage level. The high voltage on node X-bar, in turn, causes m1" to turn off and causes m3" to turn on, which cause node X to be pulled down to a low level. During a write operation, a read control signal provided on a read word line RWL maintains transistor m7 in a turned off state. A read operation by the cell 200-2 of FIG. 4C operates the same way as a read operation by cell 200-1 of FIG. 4B.

FIG. 4D is an illustrative drawing of a multi-port integrated circuit data storage cell 200-3 in accordance with a fifth embodiment of the invention. Components of the third and fifth embodiment cells 200 and 200-3 of FIGS. 4A–4D that are identical are labeled with identical reference numerals. The following description of the fifth embodiment focuses on features that are different from those described for the above embodiments. The multi-port cell of FIG. 4D combines the dual read access sections like that of the third embodiment multi-port cell 200-1 of FIG. 4B and a one-transistor write access circuitry section like the fourth embodiment cell 200-2 of FIG. 4C. The read and write operation of the fifth embodiment cell 200-3 will be appreciated from the discussion above. Thus, the multi-port cell 200-3 features reduces cell area and also permits read access to via both BL and BL-bar.

It will also be appreciated that the multi-port data storage cells 200-1 and 200-3 of FIGS. 4B and 4D share data lines (i.e., BL and BL-bar) for read and write operations. Consequently, fewer data lines are required for reads and writes. As a result, chip area can be further reduced.

It will be appreciated that the cells of FIGS. 4A–4D can be implemented with transistors having threshold voltages tailored to achieve a desired trade-off between access speed and leakage current. The storage section transistors m1"-m4" of a cell in accordance with any of FIGS. 4A–4D should have Vt values of higher magnitude than Vt values of read access transistors of the cell. The Vt value of write access transistors of such cell relative to the Vt values of storage section transistors may vary depending upon the particular application requirements. For example, the following Table shows possible combinations of relative Vt values of storage transistors, write access transistors and read access transistors in accordance with the invention.

TABLE

|  | Storage Section Transistors | Write Access Transistors | Read Access Transistors |
| --- | --- | --- | --- |
| Case 1 | High Vt | Low Vt | Low Vt |
| Case 2 | High Vt | Intermediate Vt | Low Vt |
| Case 3 | High Vt | High Vt | Low Vt |

Case 3 can be particularly useful in reducing power consumption. For example, when a write word line is enabled, specifically a pulsed write wordline signal is applied, all write transistors are turned on and BL (or BL-bar) is discharged through a write transistor and the cell transistor. For example in FIG. 4A, when X-bar is low, BL-bar is discharged through m6 and m4. The discharged BL-bar should be precharged before the next read operation. The extent of BL-bar discharging depends on the pulse width and the threshold voltage of the write transistor. The larger the pulse width, the larger BL-bar discharging. And the higher the threshold voltage of the write transistor, the smaller BL-bar discharging. When the threshold voltage of the write transistor is high, BL-bar is discharged less due to smaller current driving capability of the transistor. Therefore, a high Vt transistor is used for the write transistor, BL (or BL-bar) is less discharged for the given pulse width, and thus, less charge is needed to precharge the bit line to a certain level such as Vdd.

Also, note that Vt of PMOS storage section transistors can be different from Vt of NMOS storage section transistors. For example, the PMOS storage (latch) transistors may have a Vt of –0.8V, while NMOS storage (latch) transistors of the same cell may have a Vt of +0.6V. It should be understood that the embodiments of FIGS. 4A–4D disclose NMOS type write access and read access transistors, and that their relative Vt magnitudes are compared in the above Table with the relative Vt magnitude of NMOS storage transistors.

Persons skilled in the art will appreciate than although the embodiments of FIGS. 4A–4D show example connections of a read access sections, different connections can be employed consistent with the principles of the invention. For example, referring to the embodiments of FIGS. 4A and 4C, the gate of output transistor m8 could be coupled with node X-bar. Alternatively, for example, an S/D of output transistor m7 could be coupled to BL. As yet another alternative, the gate of output transistor m8 could be coupled with node X-bar, and an S/D of output transistor m7 could be coupled to BL. Also, for example, referring to the embodiments of FIGS. 4B and 4D, the gate of output transistor m8 could be coupled to node X-bar, and the gate of output transistor m10 could be coupled to node X. Alternatively, for example, a S/D node of m7 could be coupled to BL, and a S/D node of m9 could be coupled to BL-bar.

FIGS. 4E–4F are illustrative drawings showing precharge circuitry configurations for cells of the type shown in FIGS. 4A–4D in accordance with embodiments of the invention. Specifically, FIGS. 4E–4F show cell-1' of column-1' and cell-n' of column-n' of row-m of an illustrative SRAM array. FIG. 4E shows BL1-bar coupled to precharge transistor mp-1 (i.e., row-m, precharge, column 1) and shows BL-bar-n coupled to precharge transistor mp-n. The gates of mp-1 and mp-n are coupled so that mp-1 and mp-n are always turned on. FIG. 4F shows BL1-bar coupled to precharge transistor mp-1' and shows BL-bar-n coupled to precharge transistor mp-n'. The gate of mp-1 is coupled to receive a PPRE1 signal that can selectively turn on mp-1'. The gate of mp-n' is coupled to receive a PPREn signal that can selectively turn on mp-n'.

It will be appreciated that in the precharge circuitry configurations of FIGS. 4E–4F, precharge transistors are connected only to the bit line where read access transistors are connected. Transistors mp-1 and mp-n are respectively coupled to BL1-bar1 and BL-bar-n in FIG. 4E. Likewise, transistors mp-1' and mp-n' are respectively coupled to BL1-bar1 and BL-bar-n in FIG. 4F. The use of only a single precharge transistor per bit pair of a cell for read operations require less chip when compared with earlier precharge circuitry configurations.

In the precharge configuration of FIG. 4E, all precharge transistors are turned on continuously, there are current paths from precharge devices to read transistors, from mp-1 to m7 and m8, and also from mp-n to mn7 and mn8, for example. Since read access transistors are typically larger than latch transistors for read speed improvement, power consumption due to short current can be larger than that of conventional SRAM cells shown in FIGS. 1A–1D, for example.

Therefore, a precharge circuitry configuration such as that shown in FIG. 4F can be advantageous since precharge transistors coupled to bit lines can be controlled selectively. During a write operation, all precharge transistors are turned off. During a read operation, precharge transistors for a selected cell or a selected group of cells are activated to set the bit line or bit lines (e.g., BL-bar) to a precharge voltage. If the precharge transistors are PMOS, then the precharge voltage is $V_{DD}$. If the precharge transistors are NMOS, then the precharge voltage is $V_{DD}$-Vtn. After the selected bit lines have been precharged, a corresponding word line, WWLi, is enabled. A given enabled read operation bit line remains at a precharge level (when its cell data is low and its output transistor m8 is turned off) or discharges (when its cell data is high and its output transistor m8 is turned on).

The selective precharge control signals can be always turned on during the read operation or can be a pulsed signals having a sufficient pulse width to precharge the bit line to a certain level during the pulse duration. When precharge transistors are always turned on during a read operation, there is a current path during the read operation but a noise margin due to coupling by an adjacent signal line can be improved since BL floating condition can be eliminated. When precharge transistors are controlled by precharge signal pulse, the read speed can be improved due to larger signal development (when there is a current path, the amplitude of signal development is reduced and power consumption can be reduced due to the elimination of current paths at cost of design complexity.

FIG. 5A is an illustrative drawing of a conventional word line driver circuit 50 that can be used with data storage cell circuitry of embodiments of the present invention. FIG. 5B is an illustrative drawing of a virtual ground signal applied to the driver of FIG. 5A during active and standby modes of operation. In order to fully turn off a depletion transistor or a leaky enhancement transistor serving as a write access device, or to suppress leakage current through such device, it is desirable to pull down the voltage on a word line (WL) to a lower level in a standby mode than in an active mode. FIG. 5A shows a driver circuit 50 comprising an inverter 52 with a PMOS transistor 54 and an NMOS transistor 56. A first S/D of the PMOS device 54 is coupled to a $V_{DD}$ supply voltage. A second S/D of the PMOS device 54 and a first S/D of the NMOS device 56 are coupled to a data node 58 that is coupled to the WL. A second S/D of the NMOS 56 device is coupled to a virtual ground node 60. The gates of the PMOS and NMOS transistors 54, 56 are coupled to an address node 62 which provides address information. In operation, the address information provided to the address node 62 determines the logic level of a signal driven on to WWL by the inverter.

FIG. 5B shows that a signal φLVSS provided to the virtual ground node 60 is set to VSS during active mode operation and is set to VSS-ΔV during standby mode operation. One advantage to this scheme is that a lower ground voltage can be used during standby mode operation without imparting a speed penalty during active mode operation. One shortcoming with the driver circuit of FIGS. 5A-5B is that signal φLVSS has limited current driving capability since it is a generated signal rather than a supply such as $V_{SS}$, for example. Due to this limited current driving capability, the virtual ground node 60 has a more limited ability to discharge current over a given period of time. During active mode operation, for instance, it is desirable to shut down a word line quickly in order to reduce overall cycle time. The limited driving capability of signal φLVSS can cause delay in discharge of a word line, thereby increasing overall cycle time. In this example, cycle time is the sum of the active cycle time to enable a word line to perform a given function (e.g., read or write) and the precharge time to disable the word line and set circuits ready for the next operation.

FIG. 6A is a circuit diagram of an alternative embodiment word line write driver circuit 400. FIG. 6B is a signal diagram used to explain the operation of the alternative word line driver 400 both in active and standby modes. The word line driver 400 includes a driver section 402 used to drive the WL control line. The word line driver 400 includes bias circuitry 404 used to regulate a low voltage level provided via WL control line to the gate of write access transistor M5.

The driver section 402 includes a PMOS transistor 406 and a first NMOS transistor 408 having respective S/D junctions coupled to form an inverter. An address signal is provided to a driver input node 410. A WL control signal is provided to WL via a driver output node 412. One S/D node of PMOS transistor 406 is coupled to a $V_{DD}$ supply bias voltage source. One S/D node of NMOS transistor 408 is coupled to a virtual ground (LVGND) bias voltage node 414.

The bias circuitry 404 includes first and second NMOS transistors M11 and M12. Transistors M11 and M12 control the voltage level on the LVGND node. One S/D node of M11 is coupled to the LVGND node, and another S/D node of M11 is coupled to $V_{SS}$ supply bias voltage source. A gate of M11 is coupled to receive a first mode control signal φLV$_{SS}$ provided on a first mode control node 416. One S/D node of M12 is coupled to the LVGND node, and another S/D node of M12 is coupled to receive the first mode control signal φLV$_{SS}$ provided the first mode control node 416. A gate of M12 also is coupled to receive a second mode control signal φSTD (standby) provided on a second mode control node 418.

FIG. 6B shows that in an active mode of operation, first node control signal φLV$_{SS}$ is high, and second node control signal φSTD is low. As a result, M11 is turned on, and M12 is turned off. The virtual ground bias at the LVGND node is the $V_{SS}$ voltage level. During active mode operation, when the second NMOS transistor M11 is turned on and the third NMOS transistor M12 is turned off, the virtual ground node 414 is coupled the $V_{SS}$ supply voltage. As a result, there is current discharge capability is enhanced, and performance degradation is reduced. The discharge capability can be further enhanced by ensuring that the second NMOS transistor M11 is large enough to carry a desired discharge current level and by ensuring that its gate is driven by a voltage somewhat larger than $V_{DD}$. FIG. 5B shows that in a standby mode of operation, first node control signal φLV$_{SS}$ goes below Vss, $V_{SS}$-ΔV, and φSTD is high. As a result, M11 is turned off and M12 is turned on. The virtual ground at the LVGND node is φV$_{SS}$-ΔV. The value of ΔV is a voltage sufficient to turn off M5 strongly when M5 is a depletion transistor.

FIG. 7A shows another alternative embodiment showing only a bias circuitry portion 500 of a word line write driver circuit that can be used to drive a word line control coupled to the gate of M5. One will appreciate that the driver portion (not shown) can be identical to that described with reference to FIG. 6A. FIG. 7B is a signal diagram used to explain the operation of the bias circuitry 500.

The bias circuitry 500 includes NMOS transistors 502 and 504. One S/D node of transistor 502 is coupled to the LVGND node, and another S/D node of transistor 502 is coupled to $V_{SS}$ supply voltage. A gate of transistor 502 is coupled to receive a first mode control signal φ$_{active}$ provided to a first node control node, i.e., the gate of device 502. One S/D node of transistor 504 is coupled to a virtual ground node (LVGND), and another S/D node of transistor 504 is coupled to the virtual ground node. A gate of transistor 504 is coupled to receive a second mode control signal φ$_{standby}$ signal provided to a second node control node, i.e., the gate of device 504.

FIG. 7B shows that in an active mode, the φ$_{active}$ signal is HV$_{DD}$ ($V_{DD}$+ΔV$_1$), and the φLV$_{SS}$ signal is V$_{SS}$-ΔV$_3$. As a result, in an active node transistor 502 is turned on, transistor 504 is turned off, and the virtual ground node is at V$_{SS}$. Thus, there is a discharge path via supply voltage $V_{SS}$. Conversely, in a standby mode, the φ$_{active}$ signal is LV$_{SS}$ (V$_{SS}$-ΔV$_2$), and the φLV$_{SS}$ signal is V$_{SS}$-ΔV$_1$ when φ$_{standby}$ is Vdd. As a result, transistor 502 is turned off, transistor 504 is turned on, and the virtual ground node is at V$_{SS}$-ΔV$_1$.

The extra-low voltage LV$_{SS}$ can be produced by on-chip or external negative voltage generator. The generation of the boosted and reduced voltages are well known to persons skilled in the art, form no part of the present invention, and therefore, are not described herein.

Various modifications to the preferred embodiments can be made without departing from the spirit and scope of the invention. For example, in another alternative embodiment, for example, provides an additional address transistor in series with the transistors in position m5 or m6 in the write path. Since multiple write pass gates are connected to a given WL-W at the same time in the memory array, when WL-W is enabled, each BL-W line connected to each cell is charged or discharged according to the cell data regardless of its operation. This can cause unwanted power consumption. Wherefore, by adding one more additional address transistors in series with the m5 (and m6) of each cell, for example, it is possible to use that other transistor to write to selected cells that shares the same WL-W, thereby reducing power consumption. Thus, the foregoing description is not intended to limit the invention which is described in the appended claims.

What is claimed is:

1. An integrated circuit comprising:
   a latch circuit including,
   a first inverter including a first PMOS transistor and a first NMOS transistor with a first data node comprising interconnected source/drains (S/D) of the first PMOS and NMOS transistors;
   a second inverter including a second PMOS transistor and a second NMOS transistor with a second data node comprising interconnected source/drains (S/D) of the second PMOS and NMOS transistors;
   wherein the gates of the first PMOS and first NMOS transistors are coupled to the second data node;
   wherein the gates of the second PMOS and second NMOS transistors are coupled to the first data node;
   an input switch including,
   an access transistor including a first S/D coupled to the first data node and to the gate of the second PMOS transistor and to the gate of the second NMOS transistor and including a second S/D coupled to a first data access node and including a gate coupled to a first access control node; and
   a first output switch, which includes a first discharge path coupled separate from the latch circuit to selectably discharge a precharge voltage in response to a stored data value of the first data node or the second data node.

2. The integrated circuit of claim 1,
   wherein the first PMOS transistor and the first NMOS transistor are high threshold voltage transistors; and
   wherein the second PMOS transistor and the second NMOS transistor are high threshold voltage transistors.

3. The integrated circuit of claim 1,
   wherein the first PMOS transistor and the first NMOS transistor are high threshold voltage transistors;
   wherein the second PMOS transistor and the second NMOS transistor are high threshold voltage transistors; and
   wherein the access control transistor is a low threshold voltage transistor.

4. The integrated circuit of claim 1 further including:
   a bit line which includes the first data access node and the second data access node.

5. The integrated circuit of claim 1 further including:
   a first bit line which includes the first data access node; and
   a second bit line that includes the second data access node.

6. The integrated circuit of claim 5 including precharge circuitry coupled to only one of the first bit line or the second bit line.

7. The integrated circuit of claim 1,
   wherein the output switch includes,
   a first output transistor; and
   a second output transistor;
   wherein the first output transistor has a first S/D coupled to the discharge path and has a second S/D coupled to a first S/D of the second output transistor and has a gate coupled to one of the first data node or the second data node; and
   wherein the second output transistor has a second source/drain coupled to one of first data access node or the second data access node and has a gate coupled to a second access control node.

8. The integrated circuit of claim 7,
   wherein the first and second PMOS transistor have a first threshold voltage;
   wherein the first and second NMOS transistor have a second threshold voltage;
   wherein the first access control transistor has a third threshold voltage; and
   wherein the first and second output transistors have a fourth threshold voltage.

9. The integrated circuit of claim 7,
   wherein the first PMOS transistor and the first NMOS transistor are high threshold voltage transistors;
   wherein the second PMOS transistor and the second NMOS transistor are high threshold voltage transistors;
   wherein the first access control transistor is a low threshold voltage transistor; and
   wherein the first and second output transistors are low threshold voltage transistors.

10. The integrated circuit of claim 7,
    wherein the first PMOS transistor and the first NMOS transistor are high threshold voltage transistors;
    wherein the second PMOS transistor and the second NMOS transistor are high threshold voltage transistors;
    wherein the access control transistor is an intermediate threshold voltage transistor; and
    wherein the first and second output transistors are low threshold voltage transistors.

11. The integrated circuit of claim 7,
    wherein the first PMOS transistor and the first NMOS transistor are high threshold voltage transistors;
    wherein the second PMOS transistor and the second NMOS transistor are high threshold voltage transistors;
    wherein the access control transistor is a high threshold voltage transistor; and
    wherein the first and second output transistors are low threshold voltage transistors.

12. The integrated circuit of claim 7 further including:
    a bit line which includes the first data access node and the second data access node;
    a write word line which includes the first access control node; and
    a read word line which includes the second access control node.

13. The integrated circuit of claim 7 further including:
    a first bit line which includes the first data access node;

a second bit line which includes the data second access node;

a write word line which includes the first access control node; and a read word line which includes the second access control node.

14. The integrated circuit of claim 13 further including precharge circuitry coupled to only one of the first or second bit lines.

15. The integrated circuit of claim 1, wherein the first output switch includes a control terminal coupled to on of the first data node and the second data node.

16. The integrated circuit of claim 1, a second output switch, which includes a second discharge path coupled separate from the latch circuit to selectably discharge a precharge voltage in response to a stored a value of the other of the first data node or the second data node.

17. The integrated circuit of claim 1, wherein the first output switch includes a control terminal coupled to one of the first data node and the second data node; and further including;

a second output switch, which includes a second discharge path coupled separate from the latch circuit to selectably discharge a precharge voltage in response to a stored data value of the other of the first data node or the second data node;

wherein the second output switch includes a control terminal coupled to the other of the first data node and the second data node.

18. The integrated circuit of claim 1 further including:

a second access transistor including a first S/D coupled to the second data node and to the gate of the first PMOS transistor and to the gate of the first NMOS transistor and including a second S/D coupled to the second data access node and including a gate coupled to a first access control node.

19. The integrated circuit of claim 7 further including:

a second output switch including,
  a third output transistor;
  a fourth output transistor; and
  a second discharge path;
  wherein the third output transistor has a first S/D coupled to the second discharge path and has a second S/D coupled to a first S/D of the fourth output transistor and has a gate coupled to the other of the first data node or the second data node; and
  wherein the fourth output transistor has a second source/drain coupled to the first data access node and has a gate coupled to a third access control node.

20. The integrated circuit of claim 7 further including:

a second access transistor including a first S/D coupled to the second data node and to the gate of the first PMOS transistor and to the gate of the first NMOS transistor and including a second S/D coupled to the second data access node and including a gate coupled to the first access control node; and a second output switch including,
  a third output transistor;
  a fourth output transistor; and
  a second discharge path;
  wherein the third output transistor has a first S/D coupled to the second discharge path and has a second S/D coupled to a first S/D of the fourth output transistor and has a gate coupled to the other of the first data node or the second data node; and
  wherein the fourth output transistor has a second source/drain coupled to the first data access node and has a gate coupled to a third access control node.

21. An integrated circuit storage cell comprising:

a write word line;

a bit line;

a bit line-bar;

a read word line;

a latch circuit including, a first inverter including a first PMOS transistor and a first NMOS transistor with a first data node comprising interconnected source/drains (S/D, of the first PMOS and NMOS transistors;

a second inverter including a second PMOS transistor and a second NMOS transistor with a second data node comprising interconnected source/drains (S/D, of the second PMOS and NMOS transistors;

wherein the gates of the first PMOS and first NMOS transistors are coupled to the second data node;

wherein the gates of the second PMOS and second NMOS ) transistors are coupled to the first data node;

a first access transistor including a first S/D coupled to the first data node and to the gate of the second PMOS transistor and to the gate of the second NMOS transistor and including a second S/D coupled to the BL and including a gate coupled to the WWL;

a second access transistor including a first S/D coupled to the second node and to the gate of the first PMOS transistor and to the gate of the first NMOS transistor an including a second S/D coupled to the BL-bar and including a gate coupled to the WWL;

a first output switch, which includes,
  a first output transistor;
  a second output transistor; and
  a discharge path;
  wherein the first output transistor has a first S/D coupled to the discharge path and has a second S/D) coupled to a first S/D of the second output transistor and has a gate coupled to one of the first data node or the second data node; and
  wherein the second output transistor has a second source/drain coupled to the BL-bar and has a gate coupled to the RWL.

22. An integrated circuit comprising:

a latch circuit including, a first inverter including a first PMOS transistor and a first NMOS transistor with a first data node comprising interconnected source/drains (S/D) of the first PMOS and NMOS transistors;

a second invterter including a second PMOS transistor and a second NMOS transistor with a second data node comprising interconnected source/drains (Sib) of the second PMOS and NMOS transistors;

wherein the gates of the first PMOS and first NMOS transistors are coupled to the second data node;

wherein the gates of the second PMOS and second NMOS transistors are coupled to the first data node;

a first data access node;

a second data access node;

an input switch including, first access means for communicating data from the first data access node to the first data node; and first read means responsive to a first read control signal and to a logic state of a prescribed one of the first data node or the second data node for discharging a one charge voltage through a discharge path separate from the latch circuit if the prescribed data node is at a first voltage level and for not decharging the precharge voltage if the prescribed data node is at a second voltage level.

23. The integrated circuit of claim 22 further including:
second access means for communicating data from the second data access node to the second data node.

24. The integrated circuit of claim 22, further including:
second read means responsive to a second read control signal and to a logic state of a prescribed other of the first data node or the second data node for discharging a precharge voltage through a discharge path separate from the latch circuit if the prescribed other data node is at a first voltage level and for not discharging a precharge voltage if the other prescribed data nodeis at a second voltage level.

25. The integrated circuit of claim 22 further including:
second access means for communicating data from the second data access node to the second data node; and
second read means responsive to a second read control signal and to a logic state of a prescribed other of the first data node or the second data node for discharging a precharge voltage through a discharge path separate from the latch circuit if the prescribed other data node is at a first voltage level and for not discharging a precharge voltage if the other prescribed via node is at a second voltage level.

26. The integrated circuit of claim 22,
wherein the first PMOS transistor and the first NMOS transistor are high threshold voltage transistors; and
wherein the second PMOS transistor and the second NMOS transistor are high threshold voltage transistors.

27. The integrated circuit of claim 22,
wherein the first PMOS transistor and the first NMOS transistor are high threshold voltage transistors;
wherein the second PMOS transistor and the second NMOS transistor are high threshold voltage transistors; and
wherein the access control transistor is a low threshold voltage transistor.

28. The integrated circuit of claim 22 further including:
a bit line which includes the first data access node and the second data access node.

29. The integrated circuit of claim 22 further including:
a first bit line which includes the first data access node; and
a second bit line that includes the second data access node.

30. The integrated circuit of claim 29 including precharge circuitry coupled to only one of the first bit line or the second bit line.

31. An integrated circuit comprising:
a write word line (WWL);
a bit line (BL);
a bit line-bar (BL-bar);
a first readword line (RWLI);
a latch circuit including,
a first invertor including a first PMOS transistor and a first NMOS storage with a first data node comprising interconnected source/drains (S/D) of the first MOS and PMOS transistors;
a second inverter including a second PMOS transistor and a second PMOS transistor with a second data node comprising interconnected source/drains (S/D) of the s rid PMOS and NMOS transistors;
wherein the gates of the first PMOS end first NMOS transistors are coupled to the second data node;
wherein the gates of the second PMOS and second NMOS transistors coupled to the first data node;
an input switch including,
first access means for communicating data from th BL to the first data ode, and
first read means responsive to a first read control signal provided on th RWL1 and to a logic state of a prescribed one of the first data node or the second data node for die barging a voltage from a prescribed one of the BL or the EL-bar through a discharge path does not include any transistor of the latch circuit if the prescribed data node is at a first-voltage level and for not discharging a voltage from the prescribed one of the BL or BL-bar if the prescribed data node is at a second voltage level.

32. The integrated circuit of claim 31, further including:
second access means for voluminating data from the BL-bar to the node data node.

33. The integrated circuit of claim 31, further including:
as second read word line (RWL2); and
second read means responsive to a second read control signal on the R and to a logic state of a prescribed other of the first data node or the second data node for discharging a voltage from a prescribed other of the BL or BL-bar through a discharge path that does not include any transistor of the latch circuit if the proscribed other data node is at a first voltage and for not discharging a voltage from the prescribed other BL or BL-bar if the other prescribed data node is at a second voltage.

34. The integrated circuit of claim 31 further including:
as second read word line (RWL2);
second access means for communicating data from the BL-bar to the second data node; and
second read means responsive to a second read control signal on the RWL2 and to a logic state of a prescribed other of the first data node or the second data node for discharging a voltage from a prescribed other of the BL or BL-bar bore through a discharge path that does not include any transistor of the latch circuit if the prescribed other data node is at a first voltage and for not discharging a voltage from the prescribed other BL or BL-bar if the other prescribed data node is at a second voltage.

* * * * *

UNITED STATES PATENT AND TRADEMARK OFFICE
CERTIFICATE OF CORRECTION

PATENT NO.   : 6,888,202 B2
DATED        : May 3, 2005
INVENTOR(S)  : Sung-Mo Kang et al.

It is certified that error appears in the above-identified patent and that said Letters Patent is hereby corrected as shown below:

Delete the following figures, and replace with attached figures.

Signed and Sealed this

Twenty-ninth Day of November, 2005

JON W. DUDAS
*Director of the United States Patent and Trademark Office*

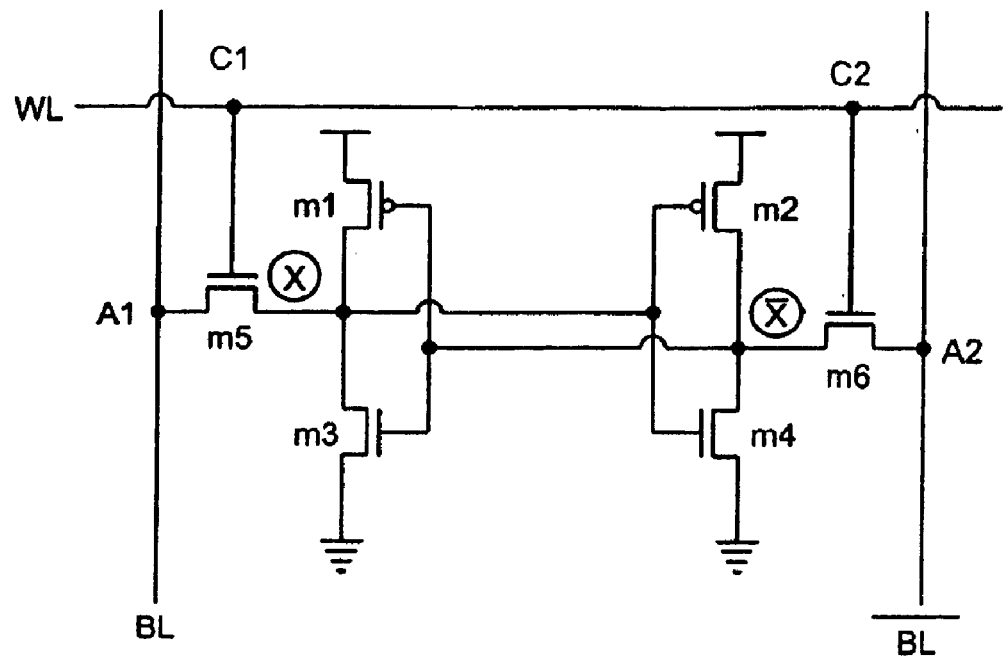
FIG._1A
*(PRIOR ART)*

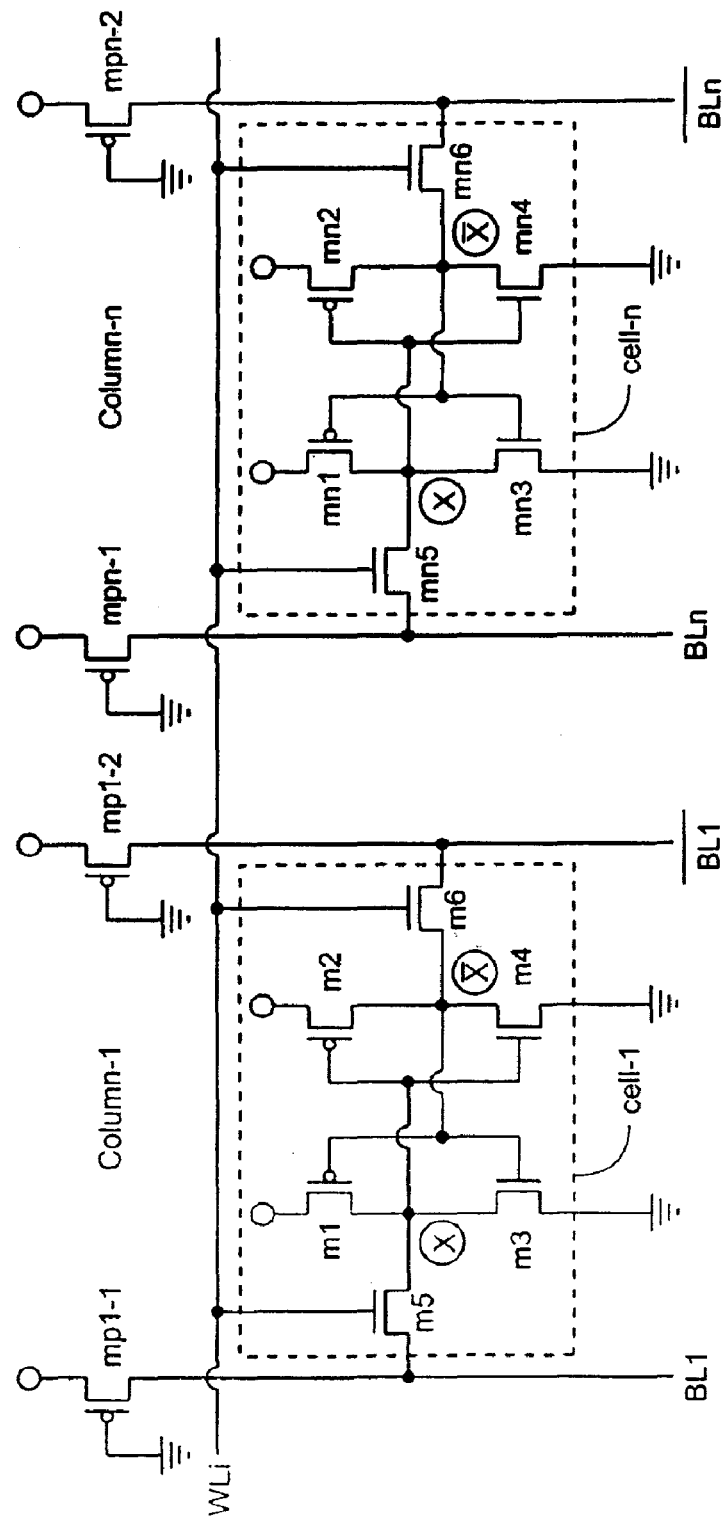
FIG._1B (PRIOR ART)

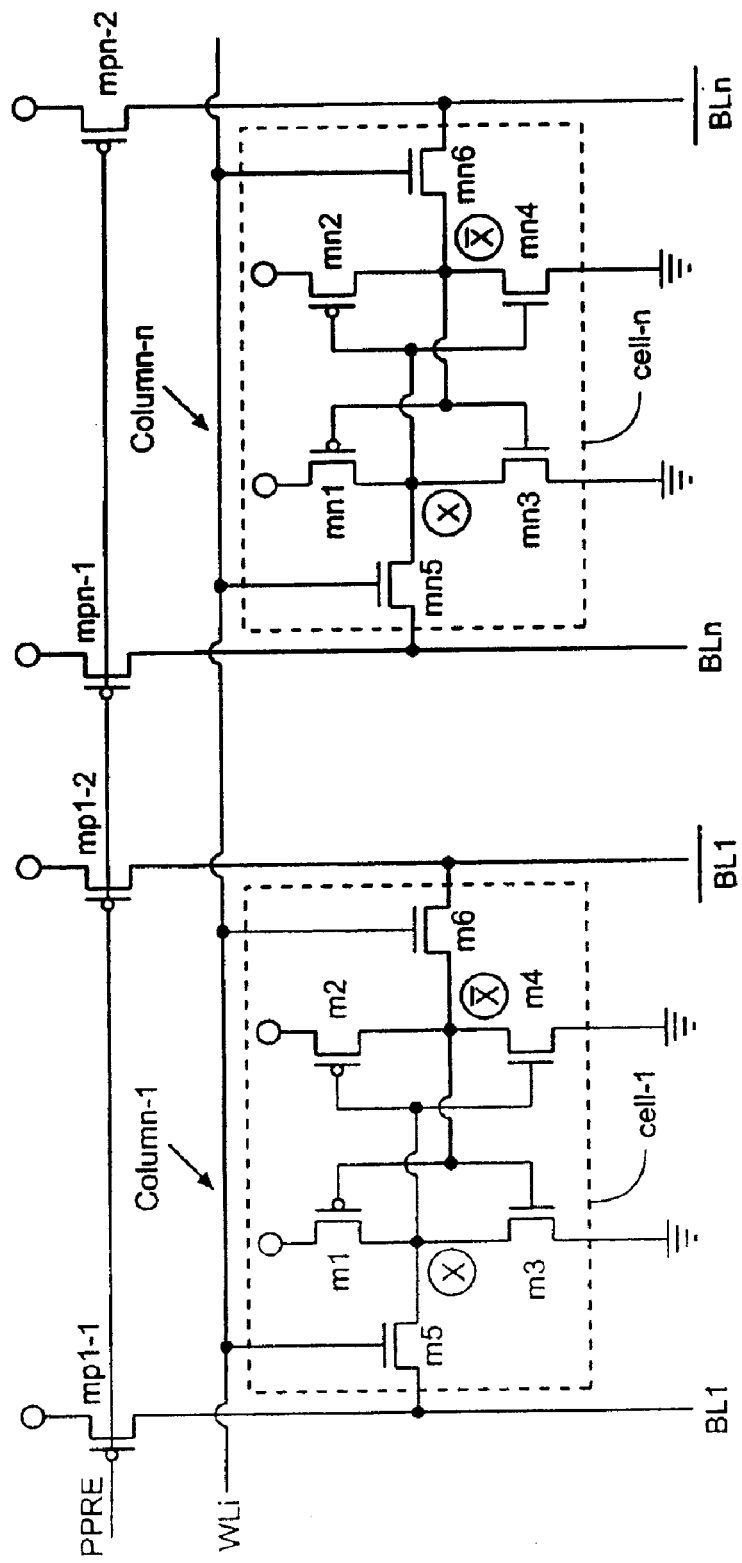
FIG._1C (PRIOR ART)

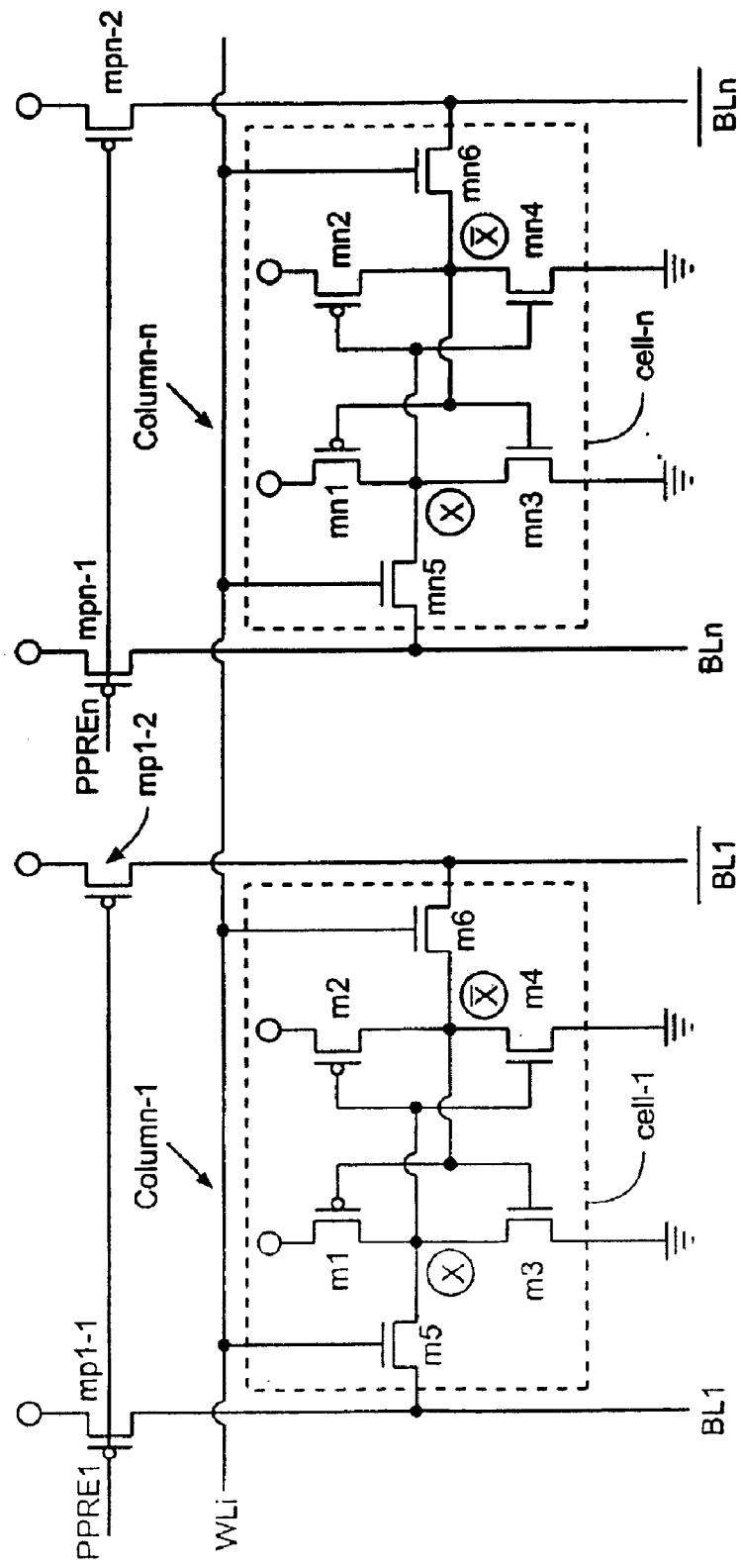
FIG._1D (PRIOR ART)

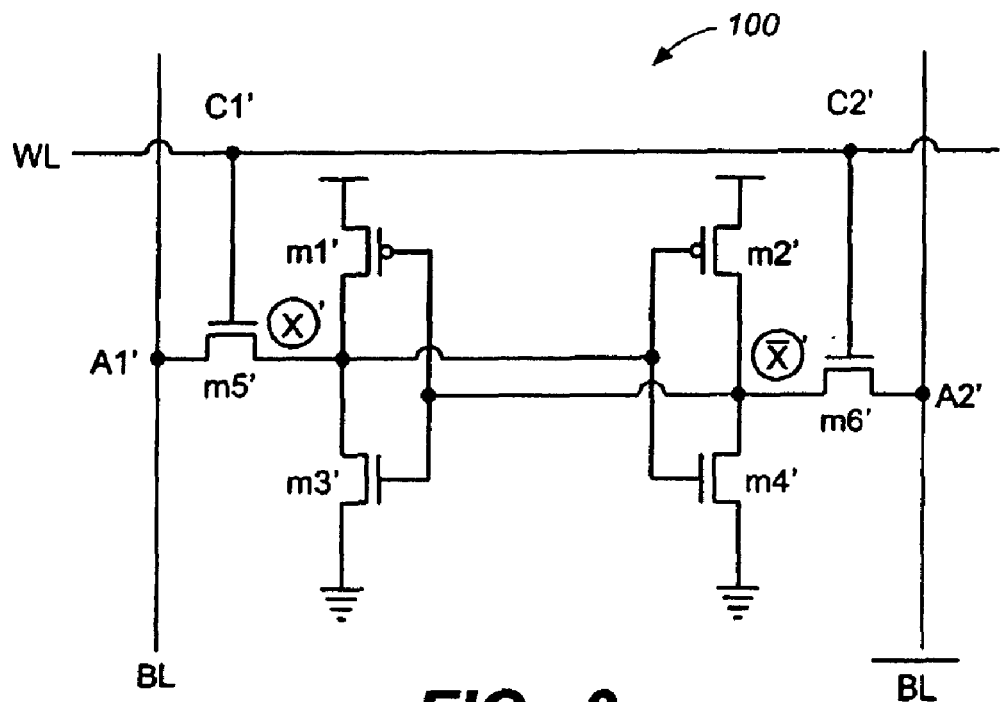
FIG._3

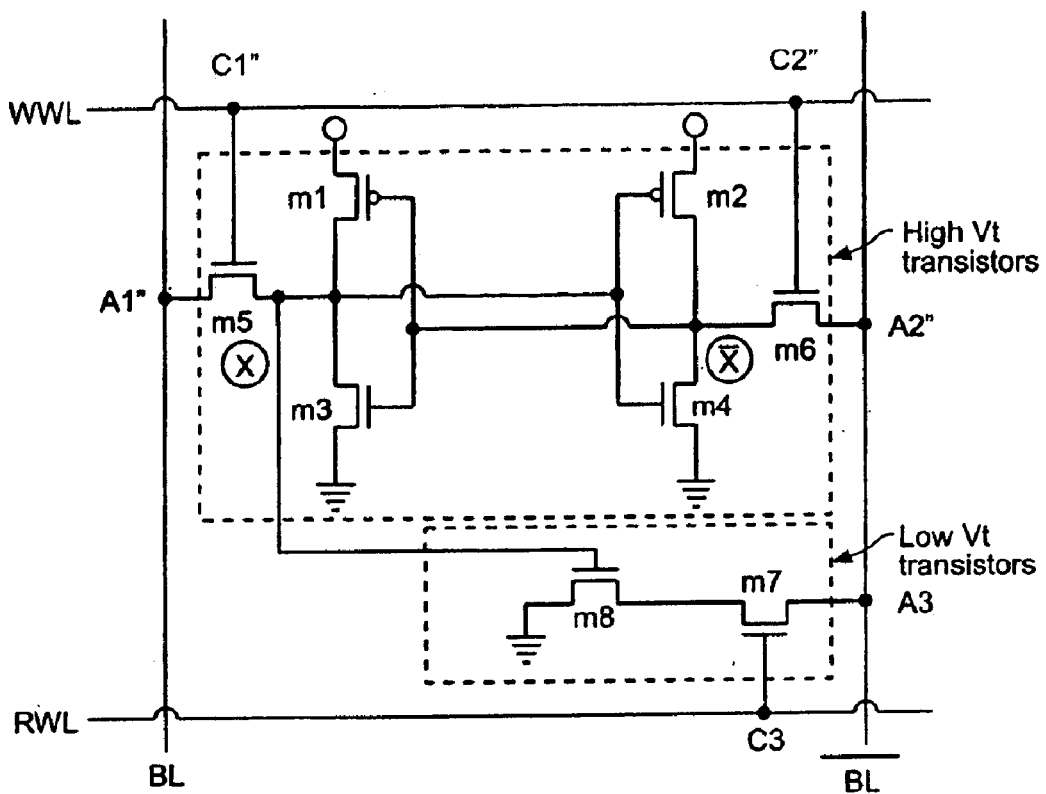
FIG._4A

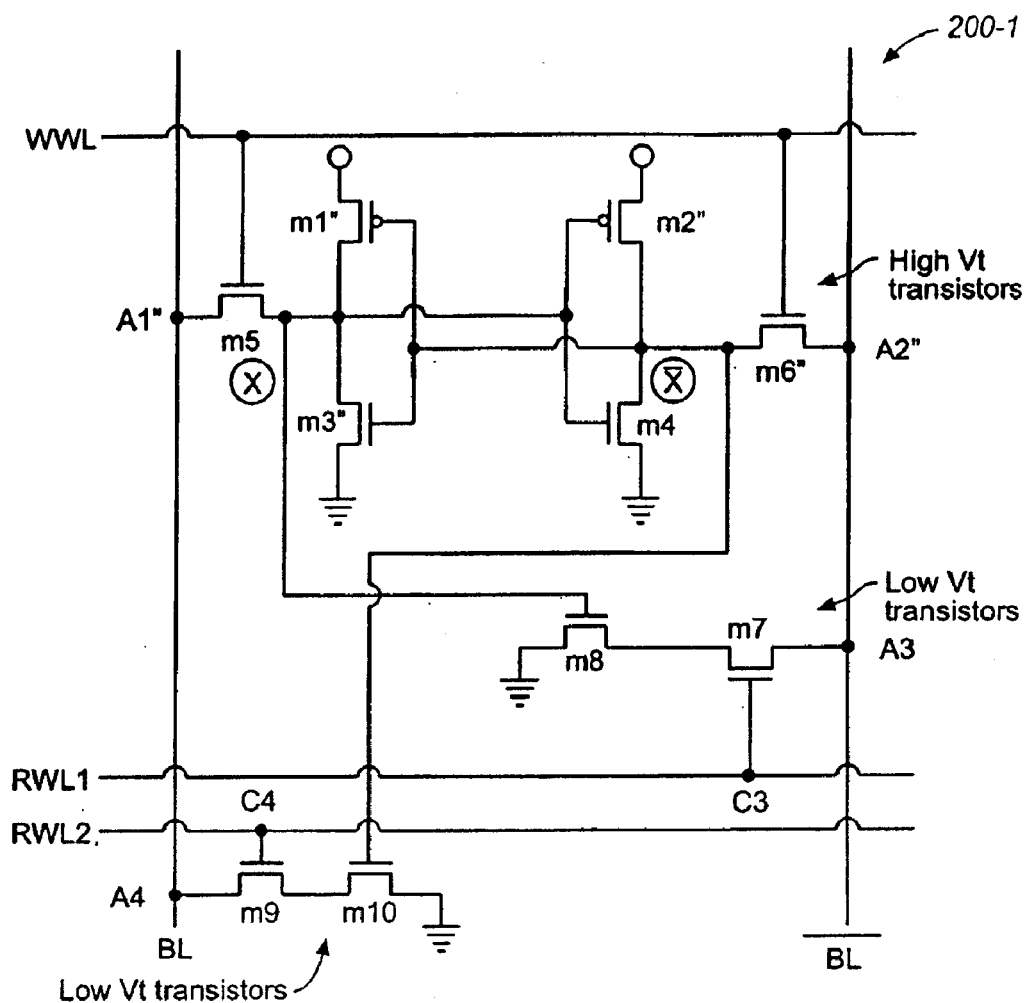
FIG._4B

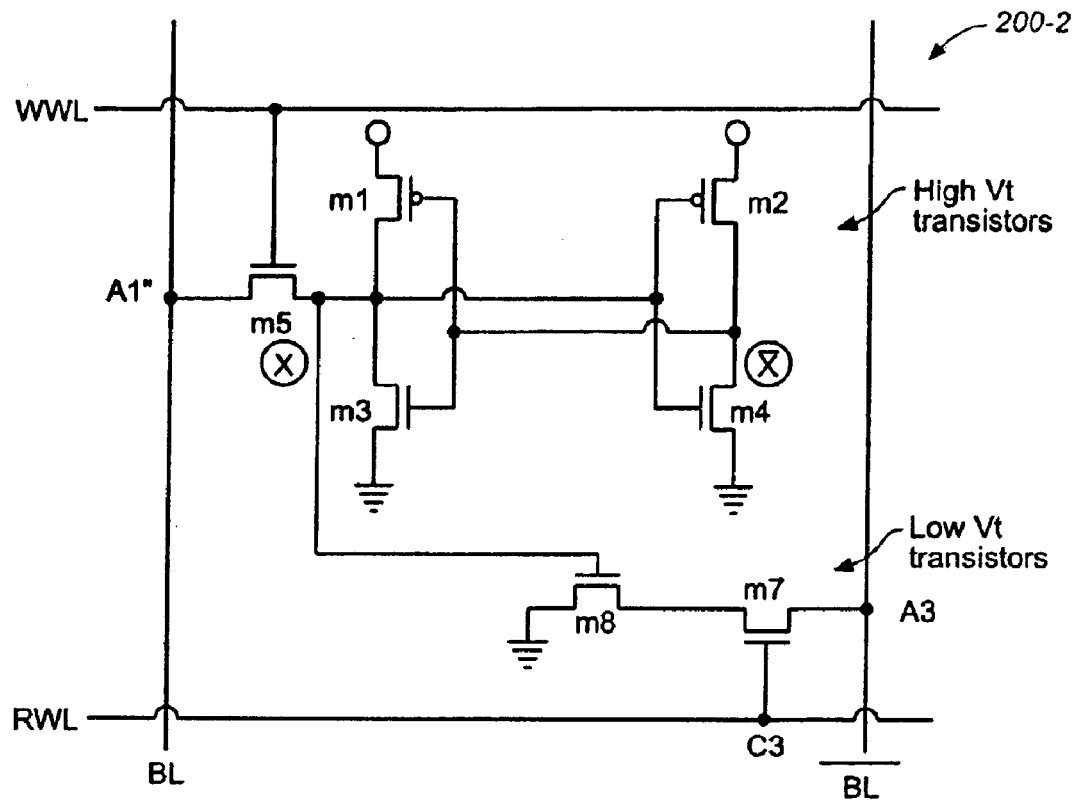
FIG._4C

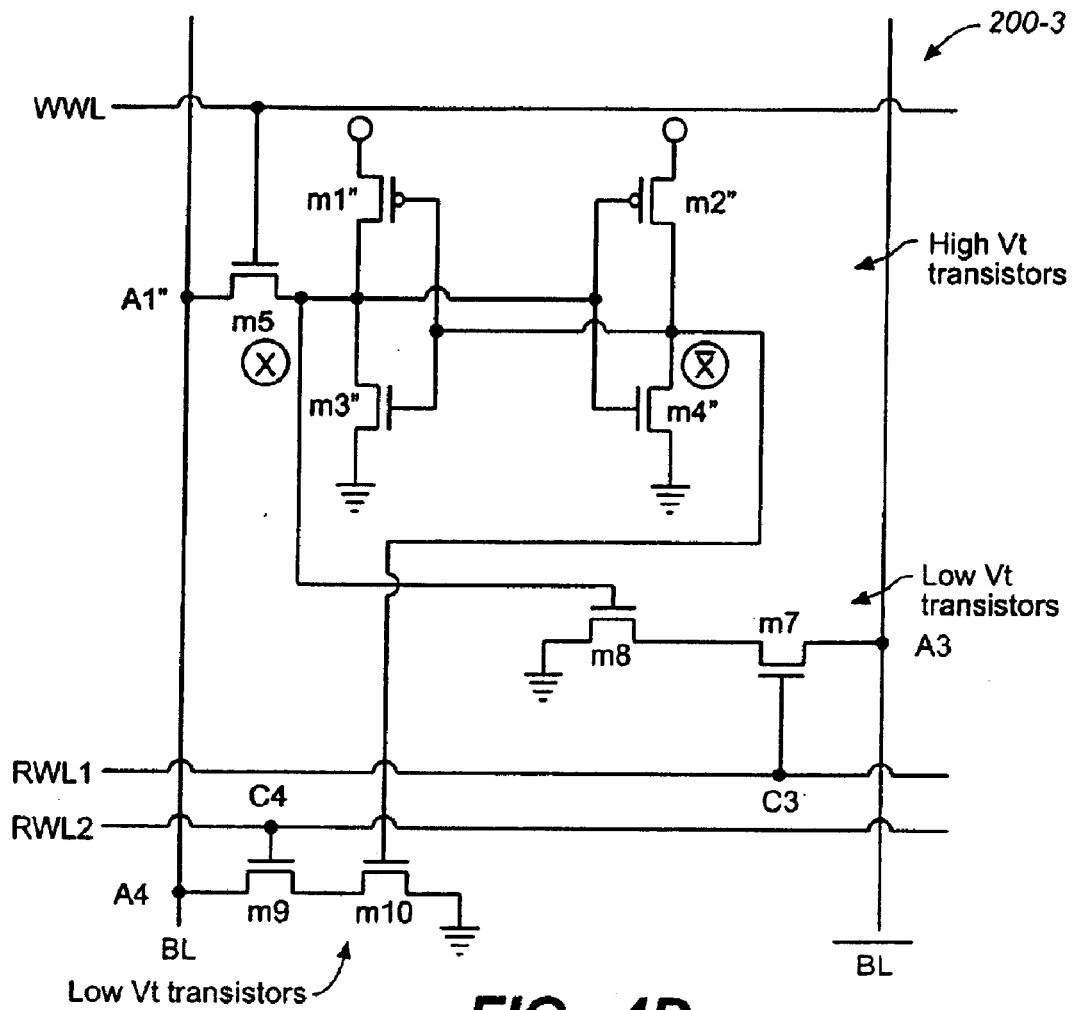
FIG._4D

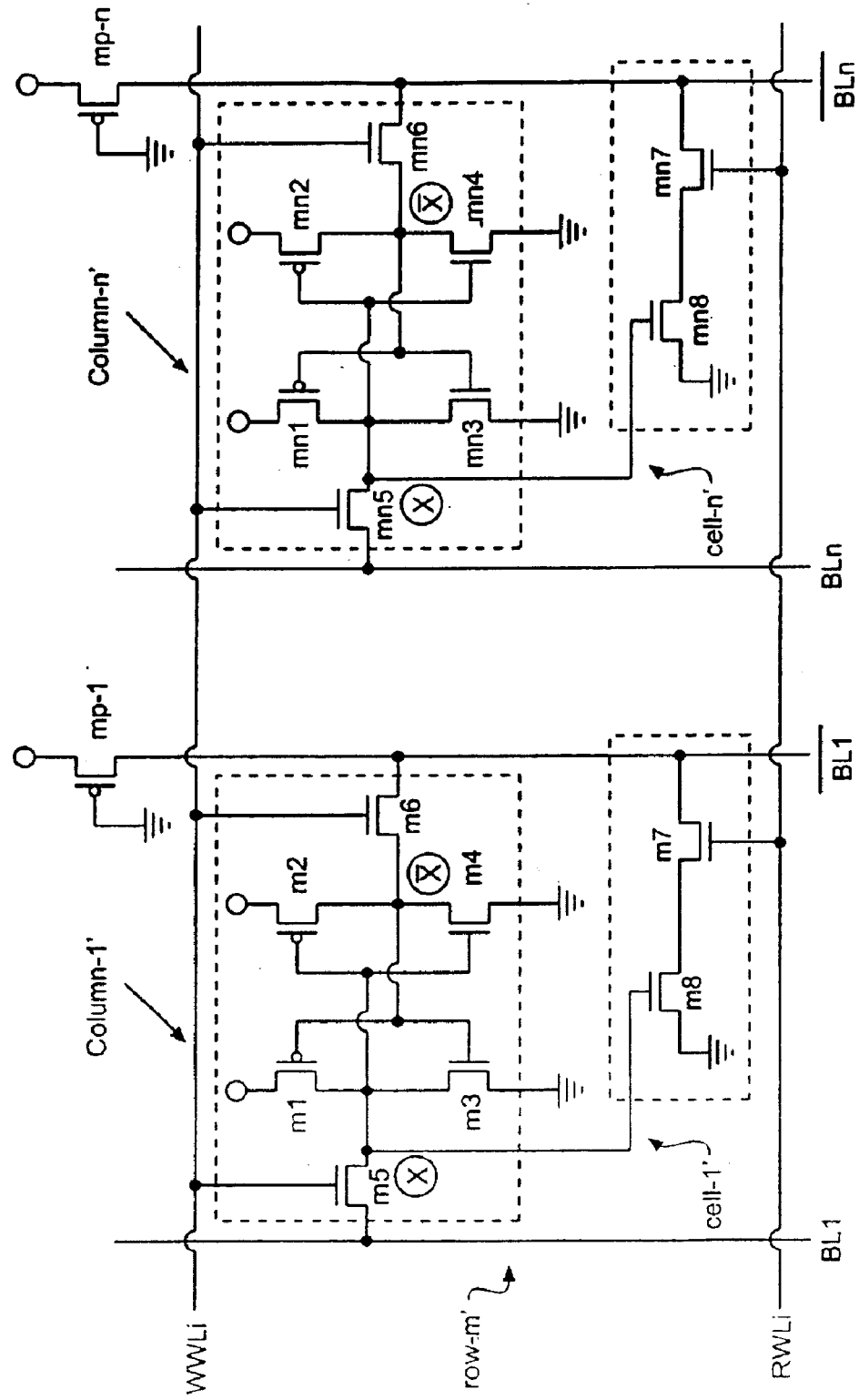
FIG._4E

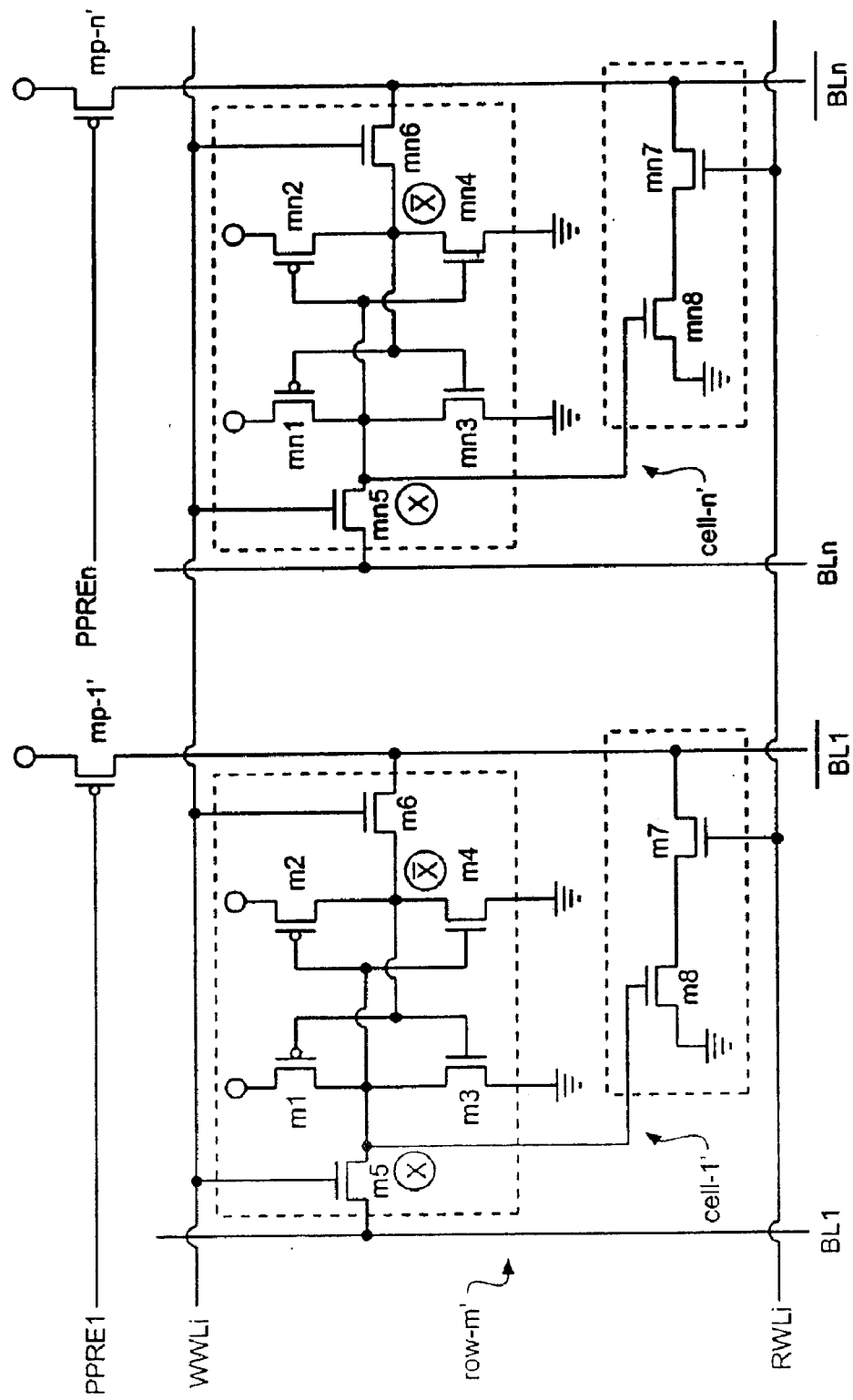
FIG._4F